(12) United States Patent
Gibbs et al.

(10) Patent No.: US 11,688,895 B1
(45) Date of Patent: Jun. 27, 2023

(54) BATTERY SAFETY SYSTEM FOR DETECTING ANALYTES

(71) Applicant: Lyten, Inc., San Jose, CA (US)

(72) Inventors: George Clayton Gibbs, Santa Clara, CA (US); Sung H. Lim, Mountain View, CA (US); Chiapu Chang, Saratoga, CA (US); Parth K. Patel, Livermore, CA (US); Beomseok Kim, Hayward, CA (US)

(73) Assignee: Lyten, Inc., San Jose, CA (US)

( * ) Notice: Subject to any disclaimer, the term of this patent is extended or adjusted under 35 U.S.C. 154(b) by 0 days.

(21) Appl. No.: 17/884,735

(22) Filed: Aug. 10, 2022

Related U.S. Application Data

(60) Provisional application No. 63/318,739, filed on Mar. 10, 2022.

(51) Int. Cl.
  *H01M 10/48* (2006.01)
  *H01M 50/30* (2021.01)
  (Continued)

(52) U.S. Cl.
  CPC .......... *H01M 10/48* (2013.01); *B60L 3/0046* (2013.01); *B60L 50/64* (2019.02); *G01R 31/382* (2019.01); *H01M 50/30* (2021.01)

(58) Field of Classification Search
  CPC ............................ H01M 10/48; H01M 50/30
  See application file for complete search history.

(56) References Cited

U.S. PATENT DOCUMENTS

| 5,590,671 A | 1/1997 | Yachera |
| 6,232,016 B1 | 5/2001 | Fink |
| (Continued) | | |

FOREIGN PATENT DOCUMENTS

| EP | 2297805 B1 | 8/2013 |
| EP | 3338337 B1 | 7/2019 |
| (Continued) | | |

OTHER PUBLICATIONS

Cai, T. et al., "Detection of Li-ion battery failure and venting with Carbon Dioxide sensors", eTransportation, vol. 7; Dec. 24, 2020; 11 pages.

(Continued)

*Primary Examiner* — Olatunji A Godo
(74) *Attorney, Agent, or Firm* — Paradice & Li LLP

(57) ABSTRACT

A battery safety system includes a flow valve and a sensing device. The flow valve is disposed on a housing of the battery and includes a first valve that is embedded inside the housing and a second valve that intersects the housing. The first valve includes a cavity through which analytes released upon electrochemical reactions within the battery flow towards the second valve. The second valve extends through the housing to the outside, and defines an opening through which the released analytes exit the housing. The sensing device is disposed within the cavity of the first valve of the valve and is situated in a manner to be in fluidic contact with the released analytes as they flow from the inside of the battery to the outside. In some aspects, the battery safety system can detect a minute presence of one or more analytes. In some aspects, the sensor is in communication with a battery management system.

24 Claims, 13 Drawing Sheets

(51) Int. Cl.
   *B60L 50/64* (2019.01)
   *B60L 3/00* (2019.01)
   *G01R 31/382* (2019.01)

(56) References Cited

U.S. PATENT DOCUMENTS

| | | | |
|---|---|---|---|
| 8,018,203 | B2 | 9/2011 | Nishi |
| 8,563,151 | B2 | 10/2013 | Matsumoto |
| 8,877,370 | B2 | 11/2014 | Kim |
| 8,928,282 | B2 | 1/2015 | Kudo |
| 9,153,991 | B2 | 10/2015 | Chaturvedi |
| 9,184,471 | B2 | 11/2015 | Lev |
| 9,293,935 | B2 | 3/2016 | Lee |
| 9,559,530 | B2 | 1/2017 | Lee |
| 9,564,762 | B2 | 2/2017 | Lee et al. |
| 9,768,477 | B2 | 9/2017 | Fukuhara |
| 9,893,387 | B2 | 2/2018 | Kabacik |
| 10,038,223 | B2 | 7/2018 | Kolosnitsyn |
| 10,110,006 | B2 | 10/2018 | Wood |
| 10,158,152 | B2 | 12/2018 | Watson |
| 10,293,704 | B2 | 5/2019 | Aronov |
| 10,389,004 | B2 | 8/2019 | Shepherd |
| 10,447,054 | B2 | 10/2019 | Christensen |
| 10,461,311 | B1 * | 10/2019 | Vissers ............... H01M 4/13 |
| 10,581,255 | B2 | 3/2020 | Hale |
| 10,744,901 | B2 | 8/2020 | Cardoso |
| 10,766,751 | B2 | 9/2020 | Kirk |
| 10,784,541 | B2 | 9/2020 | Teng |
| 10,965,130 | B2 | 3/2021 | Mikhaylik |
| 10,985,588 | B2 | 4/2021 | Mirtabatabaei |
| 11,056,728 | B2 | 7/2021 | Mikhaylik |
| 11,125,827 | B2 | 9/2021 | Wild |
| 11,165,078 | B2 | 11/2021 | Makinson |
| 2007/0229294 | A1 * | 10/2007 | Vossmeyer ........ H01M 10/4207 |
| | | | 340/636.19 |
| 2011/0059341 | A1 | 3/2011 | Matsumoto et al. |
| 2012/0150393 | A1 | 6/2012 | Knight-Newbury et al. |
| 2013/0158757 | A1 | 6/2013 | Han et al. |
| 2013/0337296 | A1 | 12/2013 | Cardoso |
| 2016/0006084 | A1 | 1/2016 | Kabacik |
| 2016/0133996 | A1 | 5/2016 | Fukuhara |
| 2018/0248386 | A1 | 8/2018 | Hale |
| 2019/0092230 | A1 | 3/2019 | Mohr et al. |
| 2019/0190044 | A1 | 6/2019 | Makinson et al. |
| 2020/0112016 | A1 | 4/2020 | Erhart |
| 2020/0164763 | A1 | 5/2020 | Holme |
| 2020/0266405 | A1 | 8/2020 | Pokora |
| 2021/0028639 | A1 | 1/2021 | Zhao |
| 2021/0231633 | A1 | 7/2021 | Lock et al. |
| 2021/0245627 | A1 | 8/2021 | Ferguson et al. |

FOREIGN PATENT DOCUMENTS

| | | |
|---|---|---|
| GB | 2440823 B | 9/2009 |
| GB | 2577088 A | 3/2020 |
| GB | 2569140 B | 6/2020 |
| GB | 2574593 B | 1/2021 |
| GB | 2581501 B | 3/2021 |
| GB | 2561777 B | 3/2022 |
| WO | 2021/045576 A1 | 3/2021 |

OTHER PUBLICATIONS

Miateev, V. et al., "Gas Leakage Source Detection for Li-Ion Batteries by Distributed Sensor Array", Sensors, vol. 19, No. 13, Jan. 2019; p. 2900.

Wenger, M. et al., "Investigation of gas sensing in large lithium-ion battery systems for early fault detection and safety improvement", IECON 2014—40th Annual Conference of the IEEE Ind. Electronics Soc.; Oct. 29, 2014; pp. 5654-5659.

* cited by examiner

BATTERY SAFETY SYSTEM FOR DETECTING ANALYTES

CROSS-REFERENCE TO RELATED APPLICATIONS

This Patent application claims priority to U.S. Provisional Patent Application No. 63/318,739 entitled "VENT SYSTEM FOR DETECTING ANALYTES" and filed on Mar. 10, 2022, which is assigned to the assignee hereof. The disclosures of all prior Applications are considered part of and are incorporated by reference in this Patent Application.

TECHNICAL FIELD

This disclosure relates generally to detecting analytes, and more particularly, to detecting a presence of relatively low concentrations of analytes.

DESCRIPTION OF RELATED ART

Chemical sensors can generate a signal in response to the presence of a particular chemical, and alert users to the presence of potentially dangerous chemicals (such as chemicals released from batteries and other devices). For example, thermal runaway within battery enclosures can lead to increasing temperature and pressure levels within the enclosure that can damage the battery, and in some instances, may even result in explosions and other user hazards. Conventional analyte sensors are not able to detect relatively low concentrations of analytes (such as less than 1 part per-billion (ppb)), which has limited the useful applicability of such sensors. As such, additional improvements are needed in chemical and vapor sensors.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter described in this disclosure may be implemented as a battery safety system that can detect a presence of analytes (e.g., gases or chemicals) released from a battery, and generate an alert indicating the presence of one or more analytes. In some instances, the battery safety system can detect and indicate the presence of one or more analytes (and their respective potential dangers) quickly enough to allow a user to mitigate the potential dangers and/or to slow (or even stop) potential thermal runaway conditions. In some implementations, the battery safety system includes a flow valve and a sensing device. The flow valve may be disposed on a housing of the battery and may include first and second valves coupled to each other. The first valve may be embedded inside the housing and may include a cavity through which analytes released from the battery may flow towards the second valve. The second valve may extend through the housing and may define an opening through which the released analytes can exit the housing through the opening defined by the second valve. The sensing device may be disposed within the cavity defined by the first valve and may be in fluidic contact with the released analytes. The sensing device may include at least one sensor configured to detect a presence of one or more of the analytes.

In various implementations, the at least one sensor may include a sensing material configured to resonate at a frequency in response to an electromagnetic signal received from an external device. In some instances, detection of the presence of the one or more analytes may be based at least in part on a comparison between the resonant frequency and a calibration curve. In other instances, detection of the presence of the one or more analytes may be based at least in part on a change in one or more properties of the sensing material responsive to the electromagnetic signal in the presence of certain analytes. The one or more properties may include at least an impedance of the sensing material. In some aspects, the sensing material is carbon-based.

In some implementations, the battery safety system may include an antenna to receive the electromagnetic signal. In some instances, detection of the presence of the one or more analytes is based at least in part on a frequency response of the sensing material to the electromagnetic signal in the presence of certain analytes. In some aspects, the sensing device may also identify the one or more analytes based at least in part on a comparison between the frequency response of the sensing material and one or more reference frequency responses. In some instances, the frequency response of the sensing material is based on resonant impedance spectroscopy (RIS) sensing.

In various aspects, the at least one sensor is coupled between a pair of electrodes disposed on a substrate of the sensing device. In other aspects, the at least one sensor may be a carbon-based sensor. In some other aspects, the at least one sensor may be a metal oxide gas sensor.

In some instances, the flow valve may include a porous membrane that can prevent moisture and contaminants from entering the battery. In other instances, a cap positioned above the porous membrane may protect the battery from external elements or environmental conditions. In some aspects, the battery may be disposed within or associated with consumer electronic devices, Electric Vehicles (EVs), Unmanned Aerial Vehicles (UAVs), or stationary Energy Storage System (ESS), among other examples.

In some implementations, analytes released by one or more of the electrochemical cells may enter the battery safety system through a fluid inlet and contact the sensing material associated with the sensing device. If one or more analytes of interest are determined to be present, the battery safety system may indicate a warning of possible battery failure and may mitigate or remediate any potential battery failure prior to an onset of the battery failure. In some aspects, battery safety systems disclosed herein may alter charging operations of the battery in response to detecting the presence of certain analytes (or other dangerous or harmful substances) released from the battery. In some other aspects, battery safety systems disclosed herein may alter discharging operations of the battery in response to detecting the presence of certain analytes.

In various implementations, the sensing device may be configured to detect a presence of certain analytes such as (but not limited to) water vapor ($H_2O$), hydrogen ($H_2$), carbon dioxide ($CO_2$), carbon monoxide (CO), ethylene ($C_2H_4$), ethane ($C_2H_6$), ethyl acetate ($C_4H_8O_2$), hydrofluoric acid (HF), ethylene carbonate ($C_3H_4O_3$), dimethyl carbonate ($C_3H_6O_3$), sulfur dioxide ($SO_2$), hydrogen sulfide ($H_2S$), or any combination thereof. In some implementations, the sensing device may include a resonator configured to resonate at a selected or configured frequency in response to an electromagnetic signal received from an external source. The sensing device may detect the presence of one or more analytes based at least in part on a comparison between the selected or configured resonant frequency and a calibration curve.

In some implementations, the signal generated by the battery safety system may indicate one or more conditions of the battery that can be used to predict an onset of thermal runaway or other battery failures. In some aspects, generation of the signal may be used to trigger changes to one or more operations of the battery. In other implementations, the signal may indicate an onset of potential battery thermal runaway. In some other implementations, a battery management system (BMS) coupled to the sensing device may initiate one or more remediation actions based at least in part on the presence of one or more analytes.

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
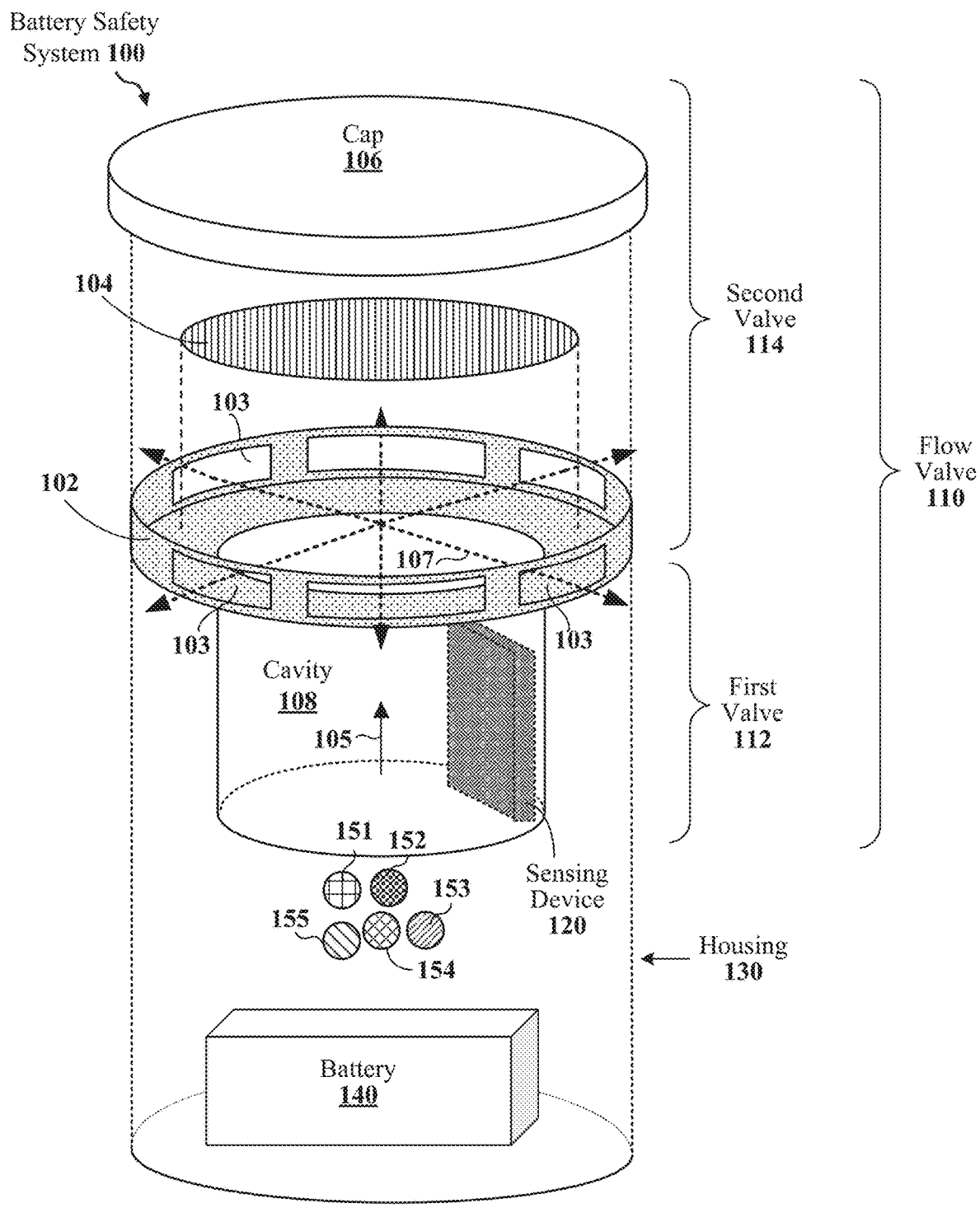
FIG. 1 shows an example battery safety system, according to some implementations.

The following description is directed to some example implementations for the purposes of describing innovative aspects of this disclosure. However, a person having ordinary skill in the art will readily recognize that the teachings herein can be applied in a multitude of different ways. The described implementations can be implemented in any environment to detect the presence of various analytes within or near any device, battery pack, package, container, structure, or system that may be susceptible to analytes. Moreover, implementations of the subject matter disclosed herein can be used to detect the presence of relatively low concentrations such as less than 1 part per-billion (ppb) of analytes. In this way, aspects of the present disclosure may detect a presence of one or more analytes released from a battery prior to an onset of a battery thermal runaway event that can cause fires and explosions. The ability to detect the presence of various presence of various analytes prior to the onset of a battery thermal runaway event may allow a user or operator of the battery sufficient time to mitigate or remediate battery thermal runaway. As such, the disclosed implementations are not to be limited by the examples provided herein, but encompass all implementations contemplated by the attached claims. Additionally, well-known elements of the disclosure will not be described in detail or will be omitted so as not to obscure the relevant details of the disclosure.

A battery typically includes a plurality of electrochemical cells (or battery cells) that can power a wide variety of systems including, for example, mobile phones, laptops, electric vehicles (EVs), factories, energy storage systems (ESS) and buildings. When the battery cells are experiencing abnormal events such as overtemperature, overcharge, external and internal short circuiting, mechanical crush, or structural penetration, exothermic reactions may take place inside the cell to produce heat and toxic and flammable off-gases within the cell. As such, the gases tend to open the battery cell housing during a first time period (i.e., "first venting"). The generated heat may fuel additional exothermic reactions that can release violent streams of toxic and flammable off-gases. In some aspects, the battery cells may be subject to venting gases during a second time period (i.e., "second venting"). Several times periods of battery venting may eventually lead to an ejection of massive amounts of heat and flammable off-gases, which in turn may lead to a battery thermal runaway event that may result in explosions. The first venting typically happens prior to the onset of battery thermal runaway events, and therefore may be considered as an indication of imminent battery failure.

Many conventional monitoring techniques use sensors to detect temperature, voltage, or analytes of interest at the manufactured burst plate of the battery cells, which corresponds to the venting position of the failing cell. As used herein, the term "burst plate" refers to a defined portion on a battery enclosure that, by design, has the lowest structural integrity for pressure release from the battery cells. The burst plate is typically a built-in feature for hard case batteries. However, for a battery enclosure that does not have manufactured burst plates (such as pouch cells), the venting locations of the failing cells within the battery enclosure are unpredictable, and conventional monitoring techniques may be overly complicated for practical applications. Additionally, incorporating an overhead chamber to mitigate such releases undesirably increases the amount of space needed to house the battery, increases overall weight of the battery, reduces an energy density of the battery, and increases manufacturing costs. As such, there is a need for a sensing system that can reliability detect an onset of battery failure and the presence of various analytes without increasing manufacturing costs, without increasing the amount of space needed, and without increasing the overall weight of the battery.

Various aspects of the subject matter disclosed herein relate to a battery safety system that may be configured to detect a presence of one or more analytes in an environment. The environment may be a battery, and the battery safety system may include a flow valve partially embedded in the battery and a sensing device disposed within the embedded portion of the flow valve. In some instances, the battery may be disposed within or associated with at least one of consumer electronic devices, EVs, UAVs, or a stationary ESS. In some implementations, the sensing device may include at least one sensor that reacts with or responds to one or more certain analytes, and the sensing device may detect a presence of the one or more certain analytes based on the reaction or response of the at least one sensor to an electromagnetic signal emitted from an external source.

In various implementations, the sensing device may generate a signal in response to detecting the presence of one or more analytes. The signal may indicate a dangerous operating mode of the battery and/or a potential onset of battery thermal runaway. In some aspects, the sensing device may output the signal to a user of the battery. In some implementations, a battery management system coupled to the sensing device may provide a warning of a potential onset of battery thermal runaway in response to the signal. In some other implementations, the battery management system may initiate one or more remediation actions in response to the signal. In some instances, the one or more remediation actions may be initiated based at least in part on the signal indicating the potential onset of battery thermal runaway.

Particular implementations of the subject matter described in this disclosure can be implemented to realize one or more of the following potential advantages. In some implementations, the battery safety system disclosed herein can detect whether first venting has started and/or can detect an onset of battery failure with sufficient warning to allow a user to mitigate or even avoid the onset of battery failure. For example, the battery safety system disclosed herein can accurately detect the presence of relatively low concentrations (<1 parts per billion) of certain analytes. Moreover, the battery safety system disclosed herein eliminates the need for overhead gas collection chambers, thereby reducing both the cost and the physical footprint of the battery safety system. In some instances, the battery safety system disclosed herein can detect an onset of a battery failure at least 40 minutes prior to battery thermal runaway, for example, thereby ensuring that the user has enough time to terminate operation of the battery (or to take remediation actions to avoid the thermal runaway). As such, aspects of the present disclosure may be able to detect an onset of battery failure or a presence of certain analytes at lower concentrations than conventional techniques, which may decrease the time period associated with alerting users of the potential onset of battery failure or the presence of certain analytes.

FIG. 1 shows an example battery safety system 100, according to various aspects of the present disclosure. In some implementations, the battery safety system 100 can be used to vent battery off-gases released from one or more cells (such as electrochemical cells) within or associated with a battery 140. In some instances, the battery safety system 100 can be used to detect a presence (or absence) of one or more analytes released from and/in a vicinity of the battery 140. In some aspects, the battery safety system 100 may generate an alert or signal indicating the presence of one or more analytes released from and/in a vicinity of the battery 140. In other instances, the battery safety system 100 may detect a potential onset of a battery thermal runaway event and, in response thereto, may generate an alert or signal indicating the potential onset of the battery thermal runaway event. In various aspects, the battery 140 may be disposed within or associated with at least one of consumer electronic devices, cars, trucks, motorcycles, buses, boats, helicopters, robots, unmanned aerial vehicles, recreational vehicles, amusement park vehicles, construction equipment, golf carts, EVs, UAVs, or a stationary ESS, among other examples. In some other implementations, the battery safety system 100 may be used in other applications.

The battery safety system 100 is shown to include a flow valve 110 and a sensing device 120. In some aspects, the flow valve 110 may include a first valve 112 and a second valve 114 coupled to each other. The flow valve 110 may be formed using any suitable materials, and can have any suitable dimensions. In some instances, the flow valve 110 can be produced using a 3-D printing process. As shown, in some aspects, the first valve 112 may be embedded inside the housing 130, and may define a cavity 108 through which analytes 151-155 released from the battery 140 flow towards the second valve 114. For example, the cavity 108 may receive one or more different types of the analytes 151-155 produced by or released from the battery 140, and the one or more different types of the analytes 151-155 may flow through the first valve 112 towards to second valve 114.

The second valve 114 includes a base 102, and may extend through and beyond the housing 130, for example, such that at least a portion of the second valve 114 is positioned on the outside of the housing 130. In some aspects, the second valve 114 may define one or more openings 103 through which the one or more different types of the analytes 151-155 can travel and subsequently exit the battery housing 130. In various aspects, each of the one or more openings 103 may be of any shape, size, or cross-sectional area suitable for flowing one or more of the analytes 151-155 released from the battery 140. In some implementations, a porous membrane 104 may be formed across a top portion of the second valve 114, parallel with a cap 106 provided on a top surface of the flow valve 110, to prevent moisture and undesirable particles from entering the battery 140. In some aspects, the cap 106 may protect the porous membrane 104 from external or environmental elements.

As shown in FIG. 1, when analytes 151-155 are released from the battery 140, the analytes 151-155 may enter the cavity 108 defined by the first valve 112 (along a direction 105), flow into the second valve 114, and exit the housing 130 through the one or more openings defined by the second valve 114 (in one or more directions 107). In various implementations, the sensing device 120 may be in fluid contact with the flow of the one or more analytes between the first valve 112 and the second valve 114. In various aspects, the one or more analytes 151-155 may flow through the cavity 108 at a flow rate based on the relative positions, orientations, shapes, and cross-sectional areas of the one or more openings 103. For example, the flow rate for a given analyte through the cavity 108 may be increased responsive to a decrease in the cross-sectional area of a respective opening 103, and the flow rate for the given analyte through the cavity 108 may be decreased responsive to an increase in the cross-sectional area of the respective opening 103. The quantity or amount of analytes that are in fluid contact with the sensing device 120 per unit time may be controlled or tuned by adjusting the flow rate, for example, using a fan, a pump, a constrictor, or a venturi, among other examples. Specifically, increasing the flow rate of the analytes through the cavity 108 may increase the degree to which the sensing device 120 reacts with or responds to the analytes, which in turn may change or alter one or more properties of the sensor device 120.

In some other implementations, the sensing device 120 may include a sensing material that can be selectively tuned to detect the presence of one or more specific analytes based at least in part on the frequency response of the sensing material to an electromagnetic signal in the presence of one or more specific analytes, even at relatively low concentrations (e.g., less than 1 ppb). As such, the battery safety system 100 may be able to detect the presence of one or more of the analytes 151-155 quickly enough to allow a user sufficient time to take mitigating or remediating action.

Figure 2:
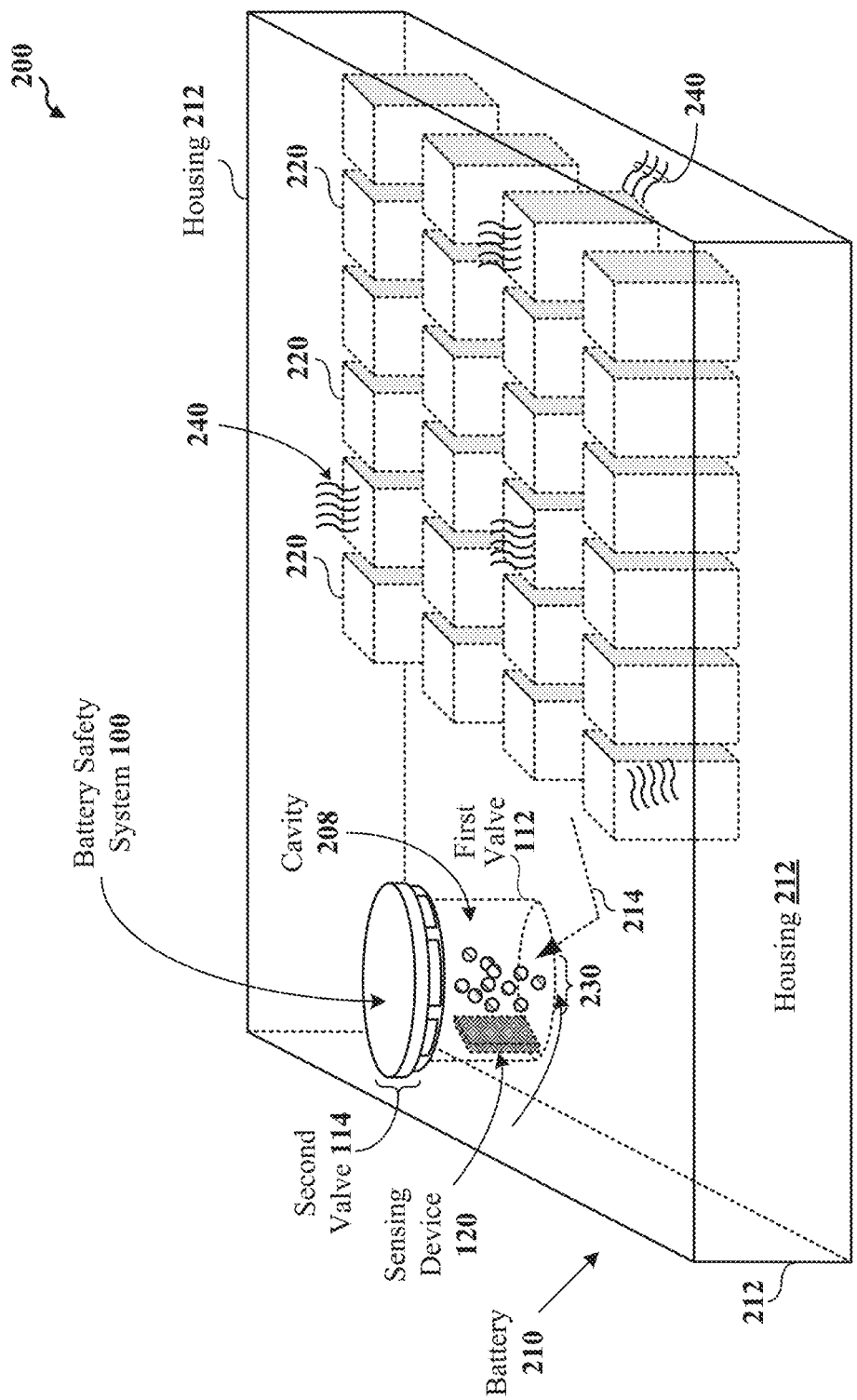
FIG. 2 shows an illustration depicting the battery safety system of FIG. 1 integrated within a battery, according to some implementations.

FIG. 2 is an illustration 200 depicting the battery safety system 100 of FIG. 1 associated with a battery 210, according to some implementations. The battery 210 may be used in any suitable applications to provide energy for the applications. In some implementations, the battery 210 may be included in a battery pack used to power an electric vehicle (EV). In some other implementations, the battery 210 may be disposed within or associated with at least one of consumer electronic devices, cars, trucks, motorcycles, buses, boats, helicopters, robots, unmanned aerial vehicles (UAVs), recreational vehicles, amusement park vehicles, construction equipment, golf carts, electric vehicles (EVs), or a stationary ESS.

The battery 210 is shown to include a plurality of battery cells 220 enclosed within a housing 212 configured with the battery safety system 100 of FIG. 1. The housing 212 can be any suitable battery enclosure, container, or mechanism capable of enclosing (and protecting) the battery cells 220 from a surrounding environment. In some instances, the housing 212 may be one example of the housing 130 described with respect to FIG. 1. As shown, the first valve 112 of the flow valve 110 of the battery safety system 100 is embedded within the housing 212 and defines a cavity 208 through which analytes (or other gases and byproducts) released from the battery cells 220 can flow and exit the housing 212 via the second valve 114. As described with respect to FIG. 1, the second valve 114 may define one or more openings (not shown for simplicity) through which analytes released from the battery cells 220 and flowing through the first valve 112 can exit the battery housing 212. In this way, the flow valve 110 may ensure that analytes released from the battery cells 220 are in sufficient fluid contact with the sensing device 120 to elicit a reaction with or a response of the sensing material (not shown for simplicity) to the analytes.

In various implementations, the battery safety system 100 may provide the only interface through which off-gases 230 containing analytes that are released from the battery 210 can exit the interior portion of (or escape from) the housing 212 and dissipate into the surrounding environment. Specifically, in some instances, the sensing device 120 is embedded within the housing 212 and positioned such that off-gases 230 released from the battery 210 flow through the cavity defined by the first valve 112 and come into fluidic contact with the sensing device 120. In this way, one or more sensing materials within or associated with the sensing device 120 may react with or respond to relatively low concentrations of certain analytes, for example, to detect the presence of the analytes. In some instances, the one or more sensing materials may be exposed to, and thus react with or respond to, the released analytes a plurality of times or instances. In some aspects, changes in impedance or other properties of the sensing materials resulting from exposure to or fluidic contact with certain analytes can be used to detect relatively low concentrations (e.g., less than 1 ppb) of the certain analytes.

The battery cells 220 may be any suitable type of battery, battery cell, battery pack, or electrochemical cell, among other examples, that provides electrical power. For example, the battery cells 220 may be metal-ion batteries, metal-sulfur batteries, metal-air batteries, or any other types of batteries. The plurality of battery cells 220 may be cells with or without a built-in burst plate in the cell design. In some instances, the plurality of battery cells 220 may be pouch cells. In some other instances, the plurality of battery cells 220 may be hard case cells.

Under normal battery operating condition, electrochemical reactions within the battery cells 220 are well-balanced such that the battery cells do not release any gases. Under abnormal battery operating conditions, the battery cells 220 may undergo undesirable electrochemical reactions to release heat and volatile organic compounds in gas phase. The resulting accumulation of gas released by the battery cells 220 typically leads to a "$1^{st}$ venting" event and case openings of the battery cells. In various implementations, the battery cells 220 may rupture at one or more positions 240 when a maximum pressure inside the battery cells 220 is reached during abnormal operating conditions. These ruptures typically occur at the weakest point of the casing associated with each of the battery cells 220, and may allow off-gases containing one or more analytes to be released. In some implementations, the battery cells 220 may be hard case cells, and the location 240 of the rupture may correspond to the battery's burst plates.

In other implementations, the battery cells 220 may not have a pre-designed burst plate, and therefore the rupture location 240 may not be known or predictable. For example, as shown in FIG. 2, each of the battery cells 220 may experience one or more ruptures at different locations 240 of the cell structure. In some instances, the ruptures may occur at locations 240 on surfaces of the battery cells 220. In some other instances, the ruptures may occur at locations 240 on one or more surfaces of the battery cells 220, along one or more edges of the battery cells 220, or any combination thereof. In various aspects, the off-gases 230 released through the ruptures may flow, in a direction 201, into the first valve 112 of the battery safety system 100. As the off-gases 230 flow from the first valve 112 toward the second valve 114, the sensing device 120 may be in fluid contact with the off-gases 230 and, in some instances, may be exposed to quantity of the analytes 151-155 of FIG. 1. As such, the sensing device 120 can detect the presence of one or more of the analytes 151-155 released at known and unknown locations (or at predictable and unpredictable locations, respectfully, thereby eliminating the need for an overhead chamber structure that collects the off-gases before sensing. In this way, the battery safety system 100 may have a relatively small footprint, as compared to conventional battery safety systems, thereby reducing manufacturing costs and complexities of the battery safety system 100.

In some implementations, one or more sensing materials associated with sensing device 120 may resonate at a selected or configured frequency in response to an electromagnetic signal received from an external device. In some instances, the sensing device 120 may detect a presence of one or more analytes based at least in part on a comparison between the selected or configured resonant frequency and a calibration curve. In other implementations, the sensing device 120 may include at least one sensor (not shown for simplicity) configured to interact with (or respond to) one or more analytes and indicate whether the one or more analytes are present. In some aspects, the at least one sensor may be a carbon-based sensor. In other aspects, the at least one sensor may be a metal oxide gas sensor (MOS). In some other aspects, the sensing device 120 may include two or more different types of sensors. For example, in some instances, a first type of sensor may be a carbon-based sensor, and a second type of sensor may be one of a nondispersive infrared (NDIR sensor), a humidity sensor, an electrochemical sensor, a chemi-resistive sensor, or an impedance spectroscopy sensor, among other examples.

In various implementations, the at least one sensor may include a sensing material coupled between a pair of electrodes disposed on a substrate. In other aspects, the at least one sensor may be coupled to only one electrode. The sensing material may be configured to detect a presence of certain analytes (such as the analytes 151-155 of FIG. 1) based on a reaction or response of the sensing material to the respective analytes. The sensing material may be or include any suitable one or more materials. For example, in some aspects, the sensing material may be a carbon-based material containing three-dimensional (3D) graphene structures. In some instances, the sensing material may be configured to detect the presence of different analytes or different groups of analytes. For example, the carbon-based sensing material may have multiple zones or regions functionalized, doped, or otherwise decorated with different metal nanoparticles or other materials configured to detect a presence (or absence) of one or more respective analytes (such as the analytes 151-155). In some other instances, the sensing device 120 may include a sensor array that includes multiple sensors disposed within the cavity of a flow-directing or flow-controlling apparatus. In some aspects, each of the multiple sensors may have a different or unique configuration. For example, the sensing material of a first sensor may be functionalized, doped, or otherwise decorated with a first material configured to detect a presence of each analyte of a first group of analytes, and the sensing material of a second sensor may be decorated with a second material configured to detect a presence of each analyte of a second group of analytes. In other instances, the sensing device 120 may have multiple carbon-based sensors and sensing materials within respective sensors may be configured to detect the presence of the same analytes or the same group of analytes.

In various implementations, the sensing device 120 may be configured to generate a signal in response to detecting the presence of one or more analytes 151-155. In some implementations, detecting the presence of analytes may be based at least in part on a change in an impedance or other properties of one or more sensing materials caused by output current changes. In some aspects, impedance or resistance changes caused by exposure to certain analytes may occur incrementally, and the overall change in value of the impedance, resistance, or other properties can be measured. In some aspects, the impedance or resistance may be measured by Impedance Spectroscopy (IS) or suitable chemi-resistive measurements techniques. In some other implementations, the sensing device 120 may include an antenna (not shown for simplicity) configured to receive an electromagnetic signal from an external device, and detecting the presence of analytes may be based at least in part on the frequency response of the carbon-based sensing material to the electromagnetic signal. In some aspects, the frequency responses may be based on resonant impedance spectroscopy (RIS) sensing.

Figure 3:
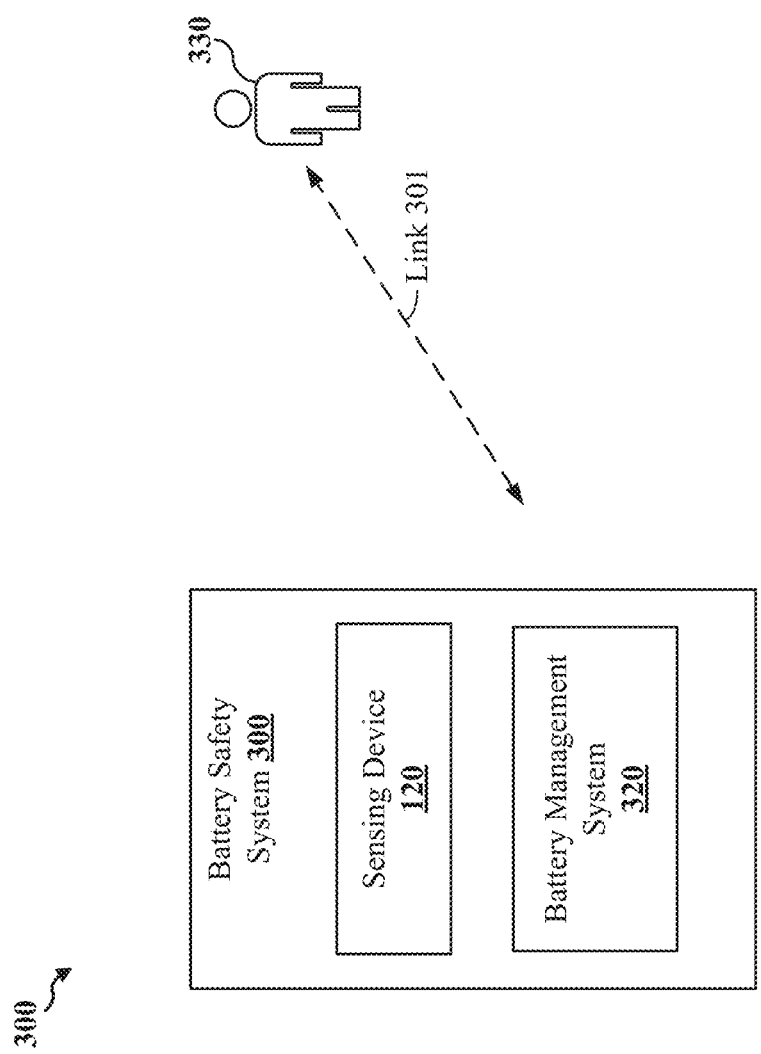
FIG. 3 shows a block diagram of an example battery safety system, according to some implementations.

FIG. 3 shows a block diagram of an example battery safety system 300, according to some implementations. The battery safety system 300, which may be an example of the battery safety system 100 of FIG. 1, is shown to include a battery management system (BMS) 320 coupled to the sensing device 120. In some implementations, the BMS 320 may provide a warning of a potential battery thermal runaway in response to the signal that is generated by the sensing device upon detecting the presence of the analytes by the sensor and may initiate one or more remediation actions to avoid the thermal runaway. In some implementations, the BMS 320 may initiate the remediation actions based at least in part on the signal indicating the potential battery thermal runaway. In some other instances, the remediation actions may include to stop any ongoing operations of the battery 210 and resume the operation after replacements and/or wait. In this way, the remediation actions may prevent thermal runaway in the battery 210.

In some implementations, the sensing device 120 may also output the signal to a user 330 of the battery that incorporates the battery safety system 300. In some implementations, the user 330 may be a person running the application that uses the battery 210 as an energy source. For example, the user 330 may be a driver of EV or personnel using or running the ESS. In some other implementations, the user 330 may be other suitable mechanism such as a human interface, a robot, or a program that is configured to deliver information to an end user. The user 330 may communicate with the battery safety system 300 over an established communication link 301, such as Wi-Fi and Bluetooth, or one or more human interfaces. The signal may indicate a dangerous operating mode of the battery. In other instances, the user may receive an indication the dangerous operating mode of in other formats, such as an audio sound, a context box displayed on a screen, a light, or any combination thereof. In this way, the user 330 is notified of the abnormal condition of the operating battery prior to an onset of battery failure, thereby allowing the user sufficient time to take safety actions and remediation actions.

Figure 4:
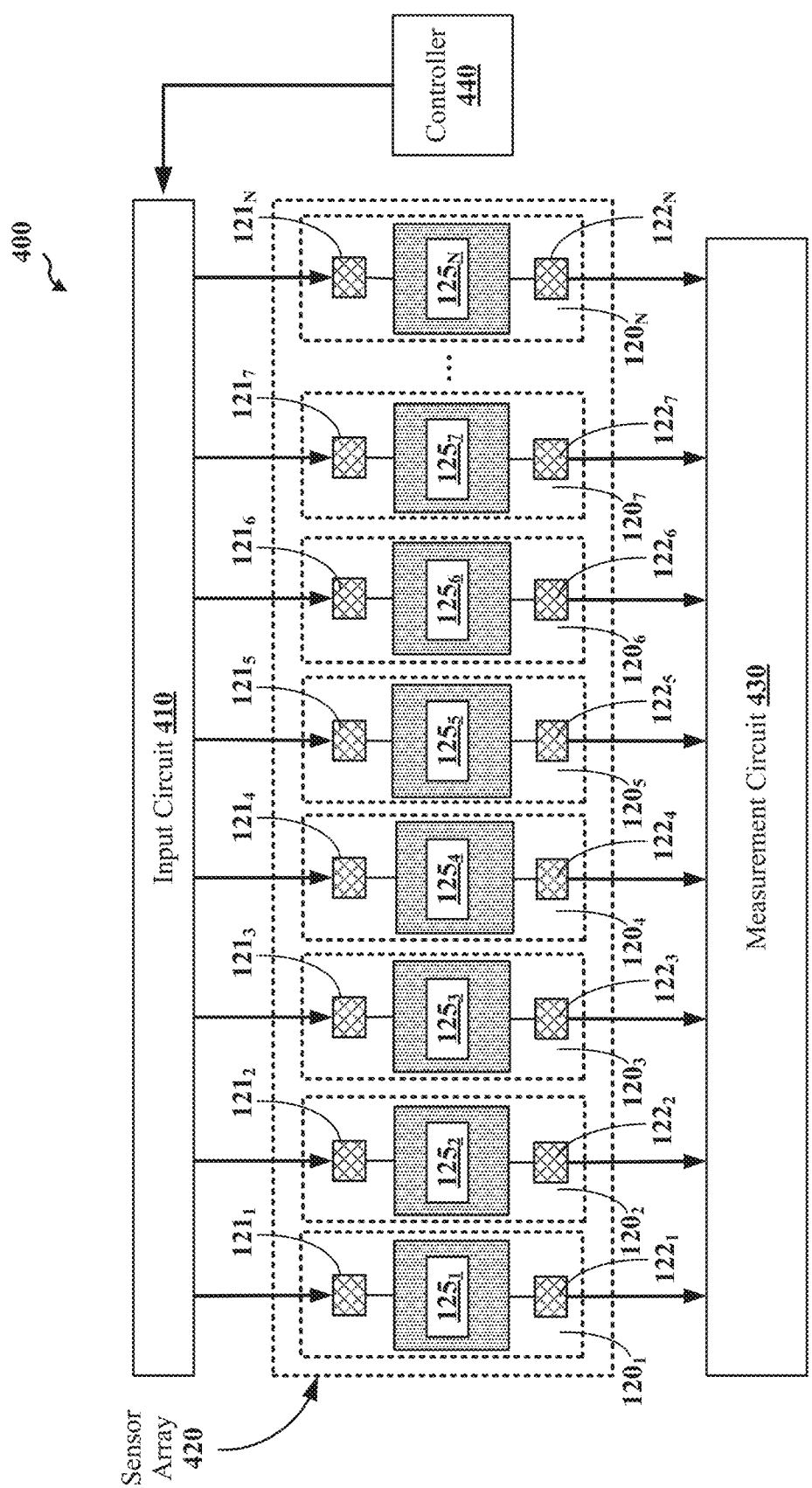
FIG. 4 shows an example sensing device, according to some implementations.

FIG. 4 shows an example sensing device 400 configured to detect the one or more analytes 151-155 of FIG. 1, according to some implementations. The sensing device 400, which may be one example of the sensing device 120 of FIGS. 1-3, is shown to include an input circuit 410, a sensor array 420, a measurement circuit 430, and a controller 440. The input circuit 410 is coupled to the controller 440 and the sensor array 420 and may provide an interface through which either a direct current (DC) or an alternating current (AC), voltages, and electromagnetic signals can be applied to the sensor array 420. The sensor array 420 may include any suitable number of sensors. For example, in the example of FIG. 4, the sensor array 420 is shown to include a number N of sensors $120_1$-$120_N$ each including a respective one of carbon-based sensing materials $125_1$ through $125_N$ coupled between a respective pair of electrodes $121_1$ and $122_1$ through $121_N$ and $122_N$, where N is an integer greater than 1. The sensing materials $125_1$-$125_N$ may be any suitable carbon-based material capable of reacting with or responding to one or more of the analytes 151-155. In some instances, one or more of the sensing materials $125_1$-$125_N$ may be a carbon-based material containing three-dimensional (3D) graphene structures. In some other instances, one or more of the carbon-based sensing materials $125_1$-$125_N$ may include different carbon allotropes or different combinations of carbon allotropes. In various implementations, the carbon-based sensing materials $125_1$-$125_N$ may have different characteristics including (but not limited to) permittivity values, sensitivities, and surface areas. In some implementations, the sensing device 400 may have only one sensor 120 including one carbon-based sensing material 125. The differences in sensing materials as discussed may be arranged as regions or zones. For example, the sensing material 125 may have different regions or zones having different characteristics and/or different types of materials.

As shown in FIG. 4, each of the first electrodes $121_1$-$121_N$ may be coupled to a corresponding terminal of the input circuit 410, and each of the second electrodes $122_1$-$122_N$ may be coupled to a corresponding terminal of the measurement circuit 430. In some other implementations, each terminal of the input circuit 410 may be coupled to a first group of the sensors $120_1$-$120_N$, and each terminal of the measurement circuit 430 may be coupled to a second group of the sensors $120_1$-$120_N$. In some instances, the first group of sensors may be the same as the second group of sensors. In other instances, the first group of sensors may be different than the second group of sensors. By using different groups or types of sensors to detect the presence of different analytes, the sensing device 400 is less likely to generates false positives.

In some implementations, the controller 440 may generate an excitation signal or field from which impedances or resistances of the sensors $120_1$-$120_N$ can be measured by the measurement circuit 430. For example, in some implementations, the controller 440 may be a current source configured to drive either a direct current or an alternating current through each of the sensors $120_1$-$120_N$. If the current applied to the sensors is DC, then resistance of each sensor will be measured. Conversely, if the current applied to the sensors is AC, then impedance of each sensor will be measured. In some other implementations, the controller 440 may be a voltage source that can apply various voltages across the sensors $120_1$-$120_N$ via corresponding pairs of electrodes 121 and 122. In some instances, the controller 440 can adjust the sensitivity of a respective sensor 120 to a particular analyte by changing the voltage applied across the respective sensor 120. For example, the controller 440 can increase the sensitivity of the respective sensor 120 by decreasing the applied voltage and can decrease the sensitivity of the respective sensor 120 by increasing the applied voltage.

The controller 440 may be configured to apply a predefined current or voltage to each of the sensors $120_1$-$120_N$, and the measurement circuit 430 can measure the impedance or resistance of each of the sensors $120_1$-$120_N$ before the sensing materials are exposed the one or more analytes 151-155 as shown in FIGS. 1 and 2. The measurement circuit 430 may use the measurements as references of the impedance and resistance to determine any differences in the impedance and resistance of the sensors after the sensing materials interact with the analytes. In some implementations, the interaction may between the sensing materials $125_1$-$125_N$ and the analytes 151-155. The sensing materials $125_1$-$125_N$ may interact with the analytes based on reaction stoichiometric ratios and the flow rate of the analytes, and this stoichiometric ratio may determine how many times an interaction can take place between the sensing material 125 and the analytes for each sensor.

For example, for an analyte with a flow rate of 10 mole/second and a reaction stoichiometric ratio of 1:1, the same interaction may take place for 10 times. During each time, the interaction between the sensing material 125 and analytes 151-155 may cause a change in output current flow through the respective sensor 120, because of which the impedance or resistance of the sensor 120 may incrementally change. In this way, for an interaction that happens for 10 times, the incremental change in impendence or resistance of the respective sensor may add up to a value that can be picked up or measured by the measurement circuit 430, and thereby detecting the presence of certain analytes. In this way, the sensing device 400 may detect presence of the analytes 151-155 with a relatively low concentration, such as less than 1 ppb, when the analytes first start to be present in the battery off-gases.

As discussed, in some instances, the sensing device 120 may include an antenna (not shown for simplicity) capable of receiving an electromagnetic signal from an external device. The measurement circuit 430 may measure frequency responses of the sensing materials $125_1$-$125_N$ to the electromagnetic signal and determine whether (or not) each of the analytes 151-155 is present based at least in part on the measurement. Specifically, when the sensor array 420 is exposed to the analytes 151-155, each of the sensing materials $125_1$-$125_N$ may generate a sensor response (i.e., frequency responses) caused by the analytes that are adsorbed, bound, or otherwise incorporated within the respective sensing materials $125_1$-$125_N$. The sensor response may resemble a chemical fingerprint that is known for a particular chemical (i.e., reference frequency responses). As the sensor array 420 is pinged with the electromagnetic signal, the measurement circuit 430 may capture the frequency responses of the sensing materials $125_1$-$125_N$ incorporating the analytes, and thereby detect a presence of the analytes. In some aspects, the measurement circuit 430 may identify the one or more analytes based at least in part on a comparison between the captured frequency response of the sensing material 125 and one or more reference frequency responses.

Figure 5:
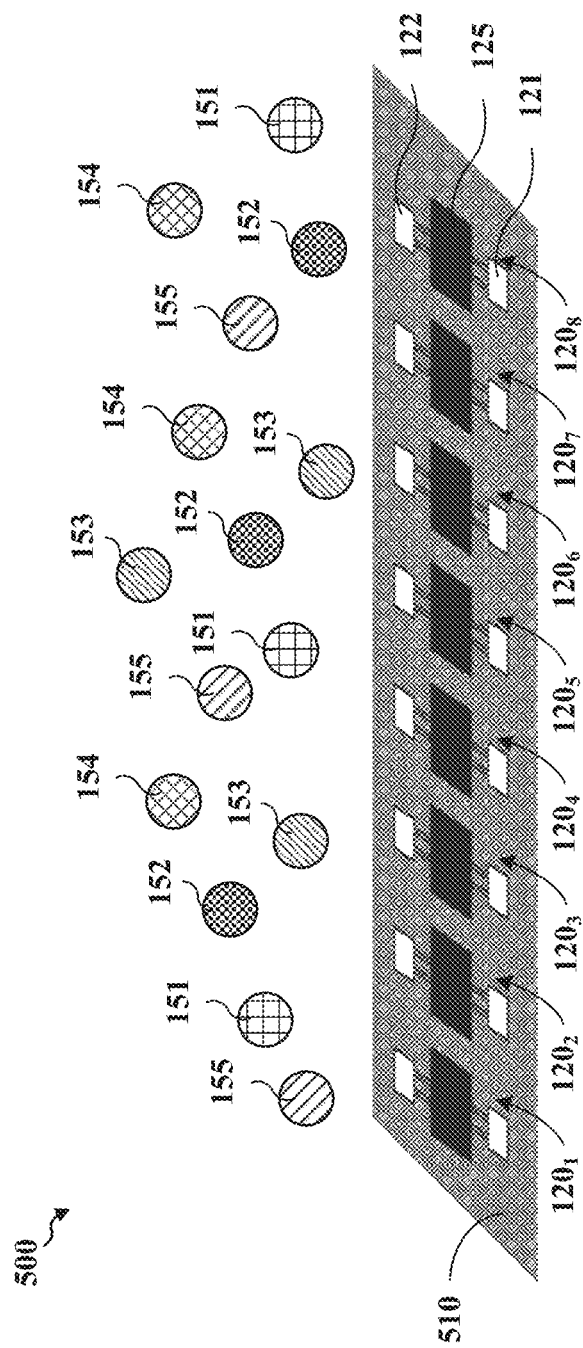
FIG. 5 shows an example sensor array, according to some implementations.

FIG. 5 shows an example sensor array 500 configured to detect one or more analytes 151-155, according to some implementations. The sensor array 500, which may be an example of the sensor array 420 of FIG. 4, is shown to include eight sensors 120 disposed on a substrate 510. In some implementations, the sensor array 500 may include other numbers of sensors. The substrate 510 may be any suitable material. In some instances, the substrate 510 may be paper or a flexible polymer. In other instances, the substrate 510 may be a rigid or semi-rigid material (e.g., a printed circuit board). In the example of FIG. 5, the eight sensors 120 are disposed next to one another in a planar arrangement. In some other instances, the sensors 120 may be disposed in other suitable arrangements, such as being stacked on top of one another in a vertical arrangement, or the sensors 120 may be on wires or mesh inside the flow valve 110 of FIG. 1.

As shown in FIG. 5, each of the sensors 120 includes a respective sensing material 125. In some aspects, the sensing material 125 may be disposed between a corresponding pair of electrodes 121-122 to receive current, voltage, or electromagnetic signals applied to the sensor 120. In other aspects, the sensing material 125 may be coupled to only one of the electrodes 121 and 122. In some implementations, the eight sensing materials 125 may include eight different types of carbon materials made of different combinations of various carbon allotropes. As one example, one sensing material 125 may include carbon nano-onions (CNOs). In some other implementations, each of the sensing materials 125 may include 3D graphene structures with different characteristics including but not limited to permittivity values, sensitivities, and surface areas. In some implementations, some or all the eight sensing materials may be functionalized, doped, or otherwise decorated with metal nanoparticles or other materials to make the sensing material 125 selective in detecting a specific target of the analytes 151-155. In the implementations where there is only one sensor 120 disposed on the substrate 510, the sensing material 125 may have different characteristics in different zone or regions within the sensing material, as if the eight sensing materials 125 as depicted in FIG. 5 are combined together to form this single sensing material 125. In some instances, the sensing material 125 may have the regions or zones decorated with different types of materials, so that a single sensing material 125 may be selective in detecting the analytes and one sensor 120 may have the same functionalities as the sensor array 500. In various implementations, the sensing material 125 may have an open pore structure with void spaces and one or more pathways. In this way, the sensing material 125 may have a high surface area that will provide additional active sites for interacting with the analytes.

In the example of FIG. 5, one or more different analytes 151-155 are in the presence of the sensor array 500. Although only five analytes 151-155 are shown in FIG. 5, the sensor array 500 can detect a greater number of different analytes. In some aspects, the analytes 151-155 can include any vapor phase and/or fluidic composition including one or more volatile organic compounds (VOCs) such as (but not limited to) water vapor ($H_2O$), carbon dioxide ($CO_2$), hydrogen ($H_2$), carbon monoxide (CO), ethylene ($C_2H_4$), ethane ($C_2H_6$), ethyl acetate ($C_4H_8O_2$), hydrofluoric acid (HF), ethylene carbonate ($C_3H_4O_3$), dimethyl carbonate ($C_3H_6O_3$), sulfur dioxide ($SO_2$), hydrogen sulfide ($H_2S$), or any combination thereof.

In some implementations, the sensing materials 125 may be configured to interact with the same or similar groups of analytes. In some other implementations, each of the sensing materials 125 may be configured to interact with a corresponding analyte or a corresponding group of analytes of the one or more analytes 151-155. In other implementations, each of the sensing materials 125 may be configured to interact with a unique group of the analytes 151-155. In one instance, a first sensor of the sensor array 500 may have the sensing material 125 decorated with a first material configured to detect a presence of a first group of the analytes 151-155, and one or more second sensors of the sensor array 500 may have the respective sensing material 125 decorated with second materials configured to detect a presence of one or more corresponding second groups of the analytes 151-155. In some aspects, the analytes in the first group may overlap the analytes in the one or more second groups. In some other aspects, the second materials may be different than each other and may be different than the first material, and the second groups of analytes may be unique subsets of the first group of analytes. For example, the first sensor may be configured to detect each of the five analytes 151-155, while each of the second sensors may be configured to detect only one of the five analytes 151-155. The first sensor may sense the environment for a relatively short period of time to provide a coarse detection of any of the analytes 151-155, and each of the second sensors may sense the environment for a relatively long period of time to confirm the presence of a respective one of the five analytes 151-155. In this way, the one or more second sensors 120 may verify the detection of various analytes by the first sensor 120, thereby reducing or even eliminating false positives.

In some implementations, the exact chemical reactivity and/or interactions between an analyte and exposed carbon surfaces of the materials 125 may depend on the type of analytes and the structure or organization of the corresponding materials 125. For example, certain analytes may be detected by one or more oxidation-reduction ("redox") type chemical reactions with metals decorated onto exposed carbon surface of the sensing materials 125. In various implementations, the sensing materials 125 may interact with the analytes based on reaction stoichiometric ratios and the flow rate of the analytes, and this stoichiometric ratio may determine how many times that an interaction can take place between the sensing material 125 and the analytes for each sensor.

In some other implementations, the interaction may cause the analytes 151-155 to be adsorbed, confined, enclosed, or otherwise "caged" within any voids and pathways provided by the open pore structure of the sensing materials 125. The exposure may cause the sensing materials 125 to produce a particular frequency response when the sensor array 500 is pinged with an electromagnetic signal (e.g., received from an external device). Such frequency responses can indicate the analytes 151-155 are present within the sensing material 125 and thereby indicates the analytes 151-155 are present in the off-gases released from the battery cells.

Figure 6:
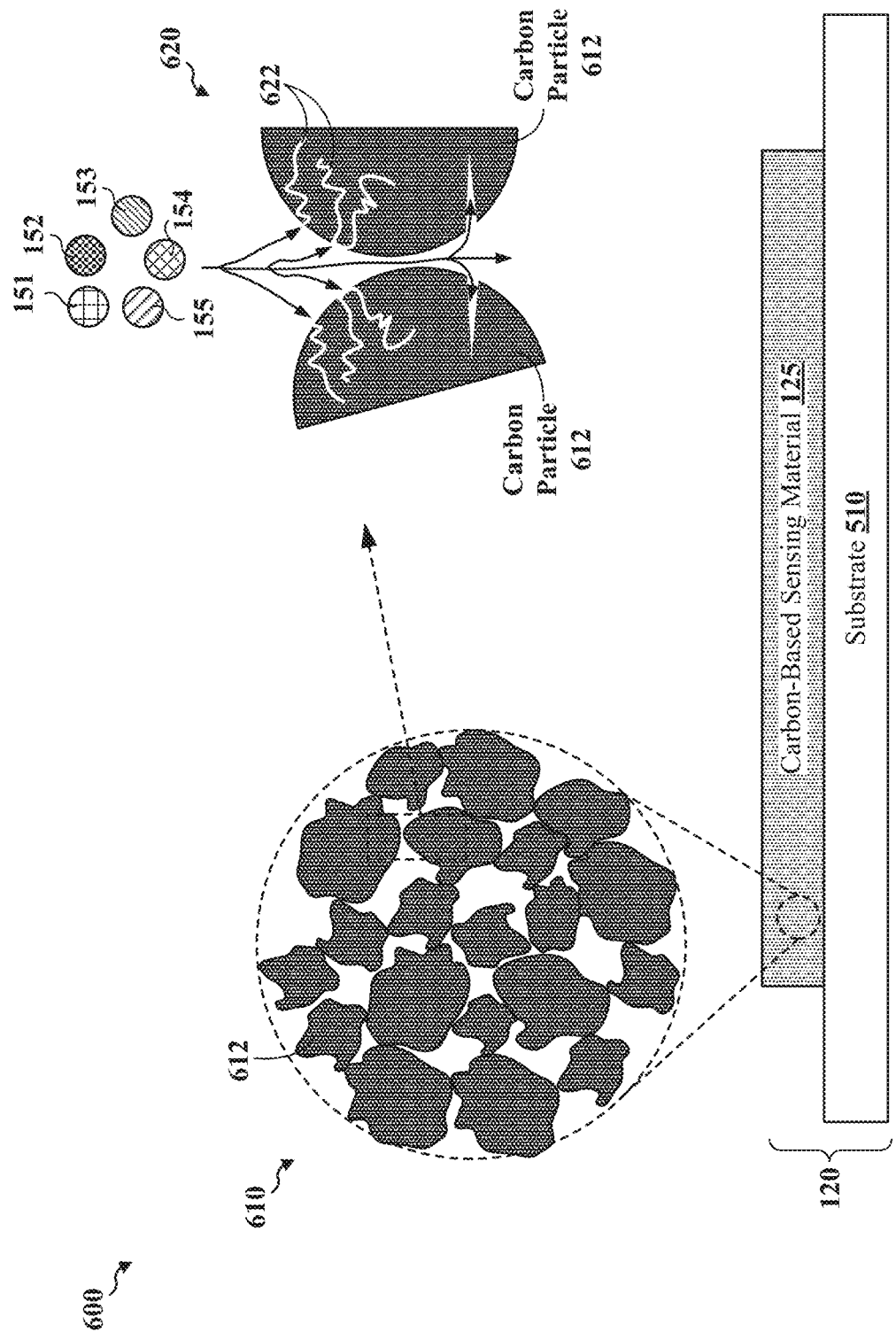
FIG. 6 shows an illustration depicting example interactions between one or more analytes and an example sensing material, according to some implementations.

FIG. 6 shows an illustration 600 depicting example interactions between one or more analytes 151-155 and the sensing material 125 of FIG. 5, according to some implementations. As discussed, the sensor 120 may include a sensing material 125 disposed on the substrate 510, and the sensing material 125 may be functionalized, doped, or otherwise decorated with a material (not shown for simplicity) configured to detect the presence of analytes 151-155. In some implementations, the sensing material 125 may have an open pore structure defined by a plurality of different graphene structures, and the open pore structure may have one or more microporous pathways or mesoporous pathways 622. Although not shown for simplicity, a polymer may bind the plurality of different graphene structures to one another to collectively form the open pore structure. In some instances, the polymer may include humectants configured reduce the susceptibility of the sensors to humidity.

As shown in FIG. 6, analytes 151-155 may take the one or more paths 622 to penetrate and interact with the sensing material 125. Inset 610 is an expanded view of the sensing material 125. The sensing material 125 is shown to include a plurality of carbon particles 612 interconnected with each other with void spaces between individual carbon particles 612. In some aspects, the carbon particles 612 may be primary particles and each particle may include a plurality of graphene flakes interconnected with each other. In some aspects, the carbon particles 612 may be aggregates and each aggregate may include a plurality of particles formed by interconnected graphene flakes.

Inset 620 is another expanded view of two carbon particles 612 depicting penetration of the analytes 151-155 into the sensing material 125. As discussed, the sensing material 125 may be functionalized, doped, or otherwise decorated with a material configured to detect the presence of analytes 151-155. In some instances, the material (not shown for simplicity) may be deposited along exposed surfaces of the carbon particle 612. In some other instances, the material may be incorporated into the one or more pathways 622 of the carbon particle 612. When the sensing material 125 is exposed to the one or more analytes 151-155, the analytes may flow through the void spaces between individual carbon particles 612 and one or more pathways 622 of each carbon particle 612. The analytes 151-155 may interact with the plurality of carbon particles 612 of the sensing material 125 and/or the decorated material. In some aspects, the interaction may cause the analytes 151-155 to be adsorbed, bound, or disposed on exposed surfaces of the sensing material 125. In some other aspects, the analytes may be confined, enclosed, or otherwise "caged" within the void spaces or one or more pathways 622 of the sensing material 125.

Figure 7B:
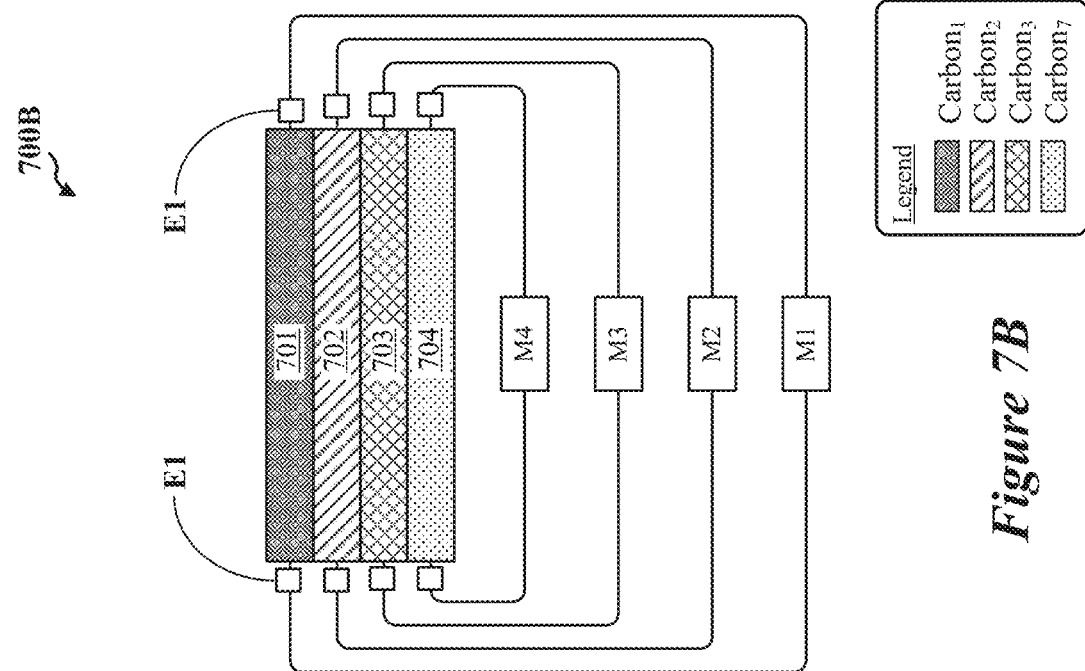
FIG. 7B shows another example sensor array, according to some other implementations.
Figure 7A:
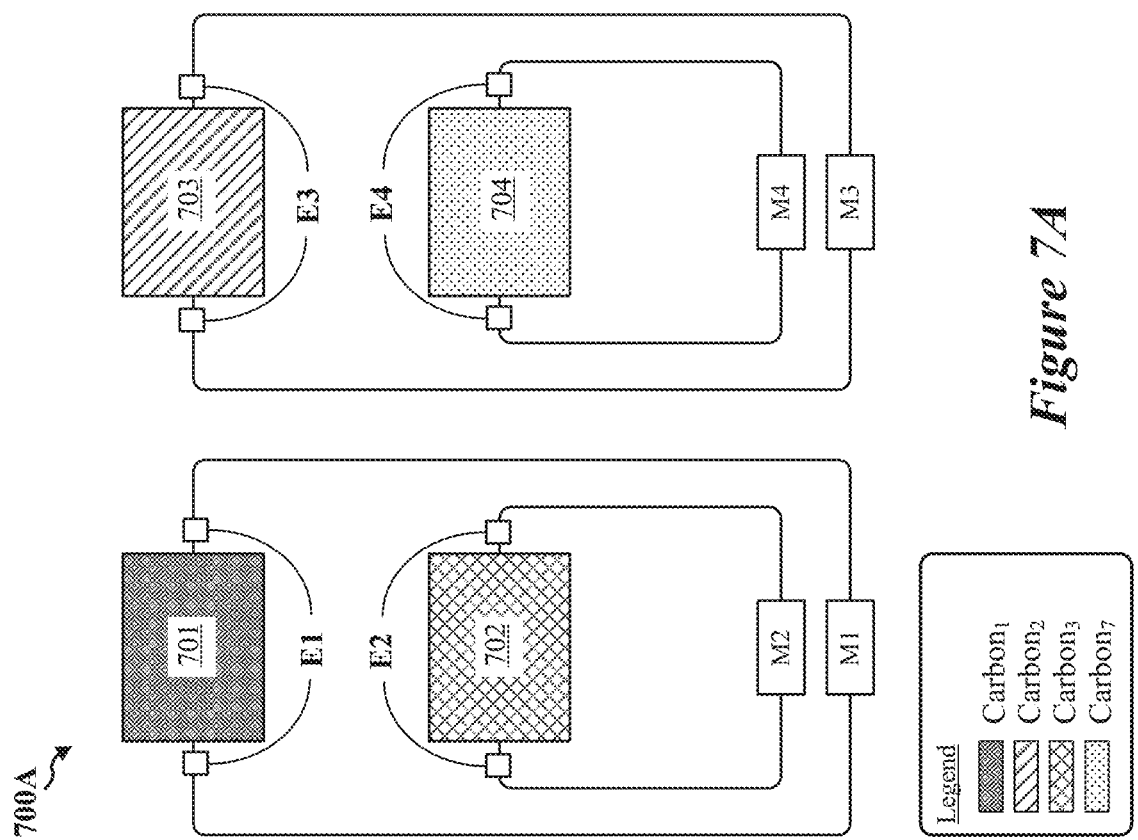
FIG. 7A shows another example sensor array, according to some other implementations.

FIG. 7A shows another sensor array 700A, according to some implementations. As shown, the sensor array 700A includes a plurality of sensors 701-704 disposed in a planar arrangement, with each of the sensors 701-704 including a sensing material carbon 1 through carbon 4 and each of the sensing material may have different characteristics. The characteristics may include (but are not limited to) permittivity, sensitivity, and surface area of the sensing material. In some aspects, the sensors 701-704 may be examples of the sensors 120 described with respect to FIGS. 1,2, and 4-6. Although the example sensor array 700A of FIG. 7A shows four sensors 701-704 arranged in a 2-row by 2-column array, in other implementations, other numbers of sensors can be disposed in other suitable arrangements.

In various implementations, the sensors 701-704 may include routing channels (not shown for simplicity) between individual deposits of the sensing materials. These routing channels may provide routes through which electrons can flow through the sensors 701-704. The resulting currents through the sensors 701-704 can be measured through ohmic contact with respective electrode pairs E1-E4. For example, a first electrode pair E1 can obtain a measurement $M_1$ of the first sensor 701, a second electrode pair E2 can obtain a measurement $M_2$ of the second sensor 702, a third electrode pair E3 can obtain a measurement $M_3$ of the third sensor 703, and a fourth electrode pair E4 can obtain a measurement $M_4$ of the fourth sensor 704.

In various implementations, each of the sensors 701-704 can be configured to react with, respond to, and/or detect a corresponding analyte or a corresponds group of analytes. For example, the first sensor 701 can be configured to react with or detect a first group of analytes in a coarse-grained manner, and the second sensor 702 can be configured to react with or detect a subset of the first group of analytes in a fine-grained manner. In some instances, the sensors 701-704 can be printed onto a substrate using different inks. Ohmic contact points can obtain the measurements $M_1$-$M_4$, either concurrently or sequentially.

FIG. 7B shows another sensor array 700B, according to some implementations. In contrast to the sensor array 700A of FIG. 7A, the sensor array 700B includes a plurality of sensors 701-704 stacked on top of one another in a vertical or stacked arrangement, with each of the sensors 701-704 including a sensing material with different characteristics. In some aspects, the sensors 701-704 may be examples of the sensors 120 of FIGS. 1-2 and FIGS. 4-6. The sensors 701-704 (and their respective sensing materials) can be sequentially deposited upon one another to form the stacked array. In some instances, separators (not shown for simplicity) can be provided between the sensors 701-704. As discussed, the sensors 701-704 may be functionalized, doped, or otherwise decorated with different materials and/or may include different types of sensing materials that can be printed in successive layers onto a substrate.

Figure 8:
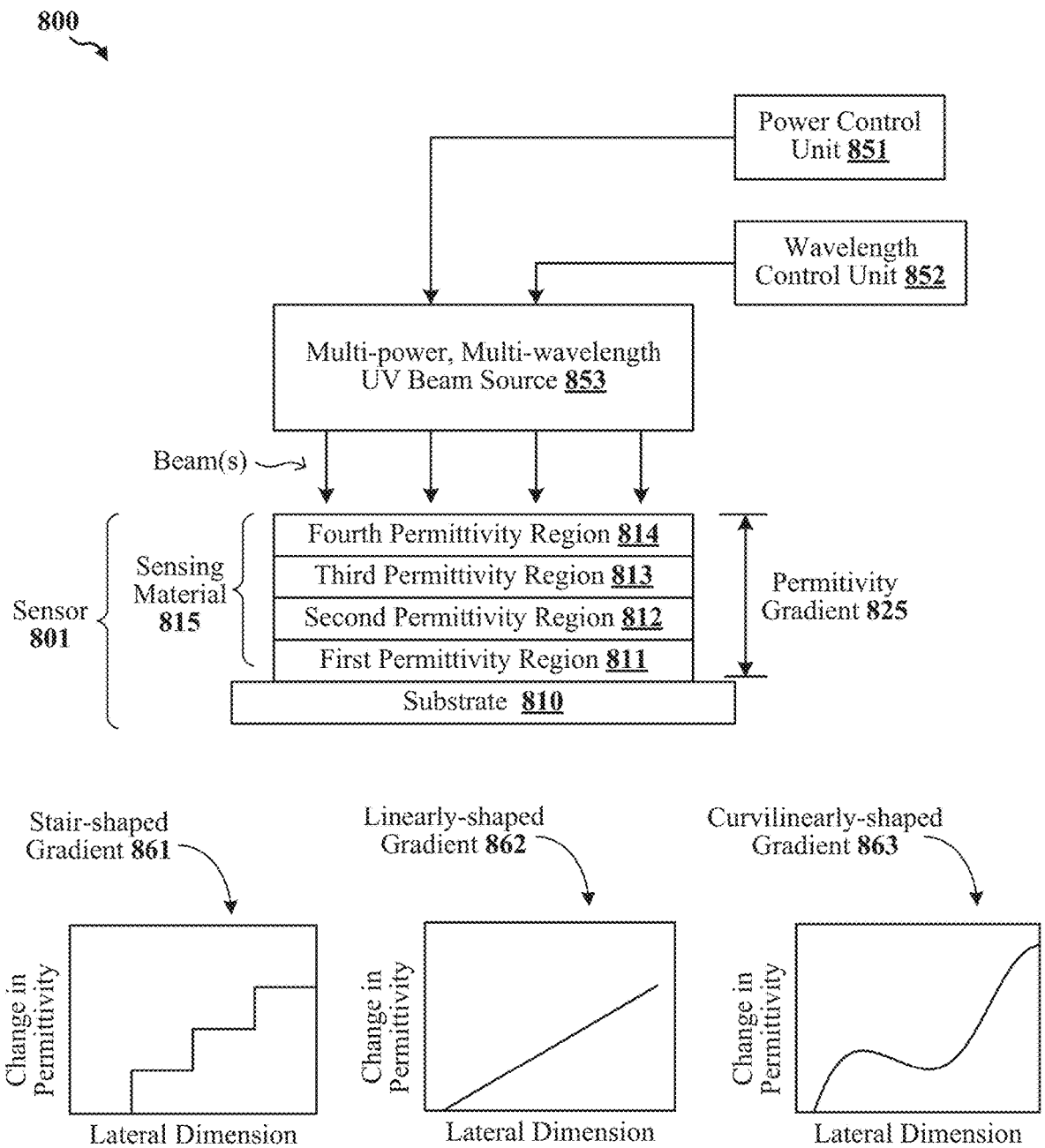
FIG. 8 shows an illustration depicting UV radiation emitted towards an example carbon-based sensor, according to some implementations.

FIG. 8 shows an illustration 800 depicting UV radiation emitted towards a sensor 801 to have a permittivity gradient within the sensing material of the sensor 801, according to some other implementations. As discussed above, a sensing material may have regions or zones with different characteristics, such as permittivity values. For the example of FIG. 8, the sensor 801 includes a sensing material 815 disposed on a substrate 810, and the sensing material 815 includes multiple regions 811-814 where the sensing material has different characteristics. In some aspects, the regions 811-814 may include same type of material, such as graphene structures, but with different surface areas and different decorated materials. In some other aspects, the regions 811-814 may include different types of materials, such as combination of different carbon allotropes. In some implementations, the regions 811-814 may be individual layers, as depicted in FIG. 8. In some other implementations, the regions 811-814 may have other suitable 3D shapes.

As shown in FIG. 8, a radiation source 853 may be used to shower the sensor 801 with radiation in a manner that excites electrons within or associated with the sensor 801, thereby increasing the energy or excited state of the electrons. In this way, the radiation source 853 can increase the sensitivity and/or the selectivity of the sensor 801 to certain analytes. In some instances, the radiation source 853 may be one or more LEDs that showers the sensor 801 with infrared light in a manner that excites electrons within or associated with the sensor 801. In other instances, the radiation source 853 may be a UV radiation source that showers the sensor 801 with UV radiation in a manner that excites electrons within or associated with the sensor 801. In some other instances, the radiation source 853 may be a visible light source that showers the sensor 801 with visible light in a manner that excites electrons within or associated with the sensor 801.

The power and wavelength of light or radiation emitted from the radiation source 853 can be controlled by a power control unit 851 and a wavelength control unit 852, respectively. In some implementations, the permittivity of each of the sensing material layers 811-814 can be configured or modified by adjusting the power level and/or wavelength of the emitted light or radiation. Specifically, after the sensing material layers 811-814 are bombarded with UV radiation, each of the sensing material layers 811-814 may have a different permittivity, and therefore may resonate at a different or unique frequency. In some aspects, differences in permittivity of the sensing material layers 811-814 may create a permittivity gradient 825 across one or more portions of the sensor 801. The permittivity gradient 825 may correspond to a stair shaped gradient 861, a linearly shaped gradient 862, or a curvilinearly shaped gradient 863. In various implementations, different portions of the sensing material 815 may have different permittivity values selected in a manner such that the sensing material 815 resonates at different frequencies or exhibits different resonance signatures when exposed to different analytes (such as the analytes 151-155 depicted in FIGS. 1 and 5-6). In some instances, exposure of the sensing material 815 to UV radiation may cause a first region of the sensing material 815 to have a first permittivity associated with a first resonant frequency or a first resonance signature when exposed to a first analyte, and may cause a second region of the sensing material 815 to have a second permittivity associated with a second resonant frequency or a second resonance signature when exposed to a second analyte that is different than the first analyte. In this way, when the sensing material 815 is exposed to analytes 151-155, the resonance of different portions or regions of the sensing material 815 can be measured to detect a presence of a combination of one or more analytes. Such detection of analytes provides a more reliable solution compared to currently existing gas sensing technologies, and thereby further reducing false alerts or false alarms of potential battery thermal runaways.

Figure 9:
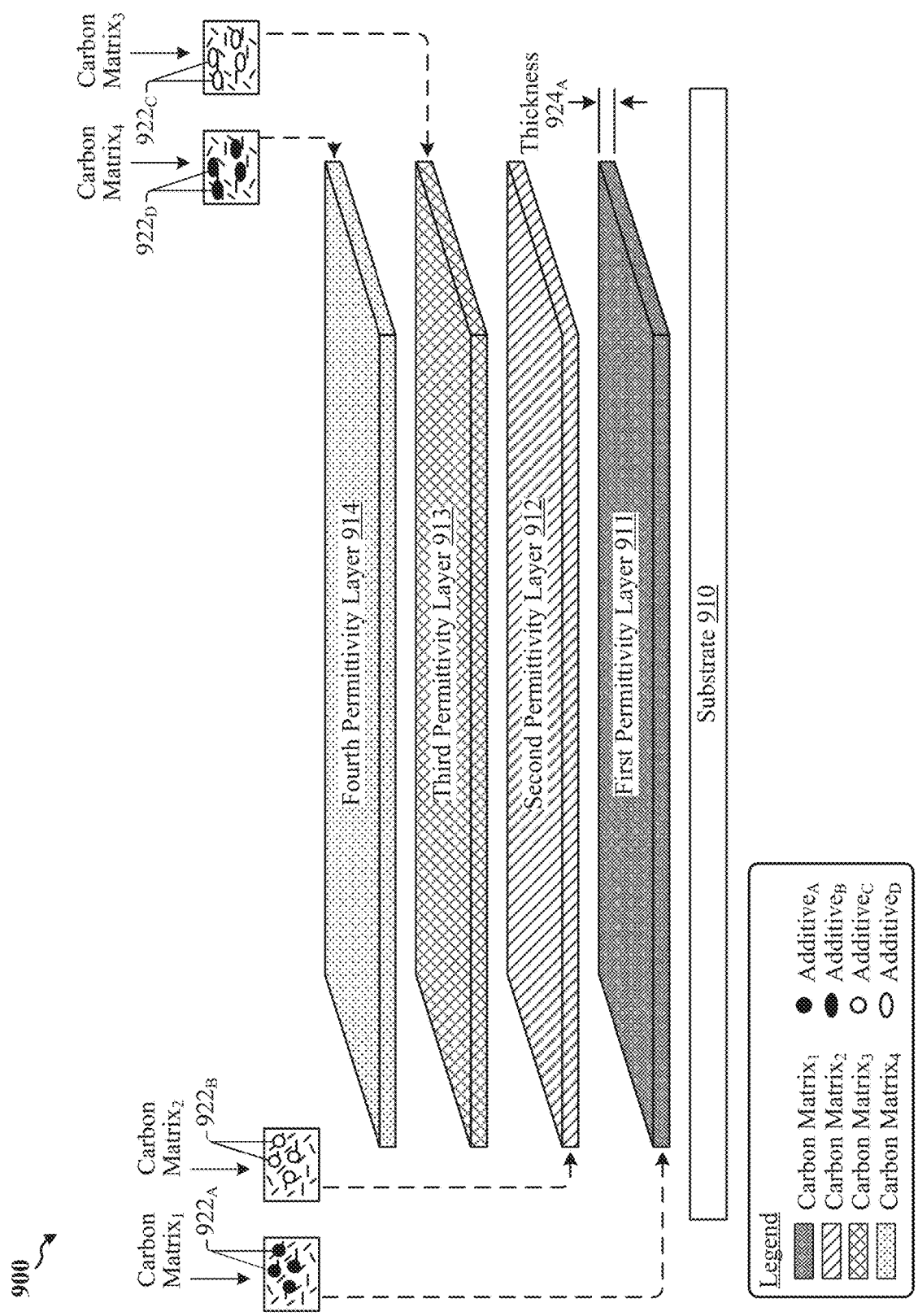
FIG. 9 shows another example carbon-based sensor, according to some other implementations.

FIG. 9 shows another sensor 900, according to some other implementations. The sensor 900, which an example sensor disclosed herein, is shown to include a sensing material that has multiple regions 911-914 and in each of the regions, the sensing material may include a carbon matrix (such as carbon matrix 1, carbon matrix2, carbon matrix3, carbon matrix4) functionalized, doped, or otherwise decorated with a respective additive A-D that may be configured to interact with a certain analyte or a certain group of analytes. The combinations of carbon matrices and additive may be selected based on the combination's sensitivity to a particular analyte of interest. As shown in FIG. 9, the regions 911-914 are layers and the layers 911-914 are successively disposed to form a stack of layers, with the first layer 911 disposed on the substrate 910. The layers 911-914 may have different thicknesses. For example, a first deposited layer can have a thickness 924 between approximately 10 nanometers (nm) and approximately 100 nm, whereas another deposited layer can have a thickness between approximately 500 nm and approximately 1,000 nm. In some aspects, thickness of a particular layer may depend on characteristics of the additive for that layer, characteristics of the analyte of interest, and innate binary-tertiary interactions by and between the constituents of the layer. In some other implementations, the regions 911-914 may have other suitable 3D shapes.

In various implementations, the sensing material of the sensor 900 may have an open pore structure, and each carbon matrix 1-4 may have a 3D network structure with void spaces and pathways to embed the additives A-D. The open pore structure of the sensing material provides an extremely open volume where the one or more analytes 151-155 (i.e., analyte of interest) can be incorporated into (and evacuated from) the open pore structure. In particular, the open pore structure can provide a large effective total surface area of active sites where analytes can interact with the carbon matrix. In this way, when the sensor 900 is exposed to the one or more analytes 151-155, the analytes can be quickly incorporated into the open pore structure, thereby causing a change in the impedance and/or the resonance of the sensing material that can be measured using IS, RIS or chemi-resistive measurement techniques. As such, analyte detection (e.g., sensitivity) of the sensors disclosed herein based on incorporating of the analyte into the open pore structure is greatly enhanced from the conventional analyte detection systems. Such enhanced sensitivity enables an early yet accurate detection of analytes at a relatively low concentration level <1 ppb and thereby realizes an advance alert/warning of potential battery thermal runaway that is dependent on this early detection.

Figure 10A:
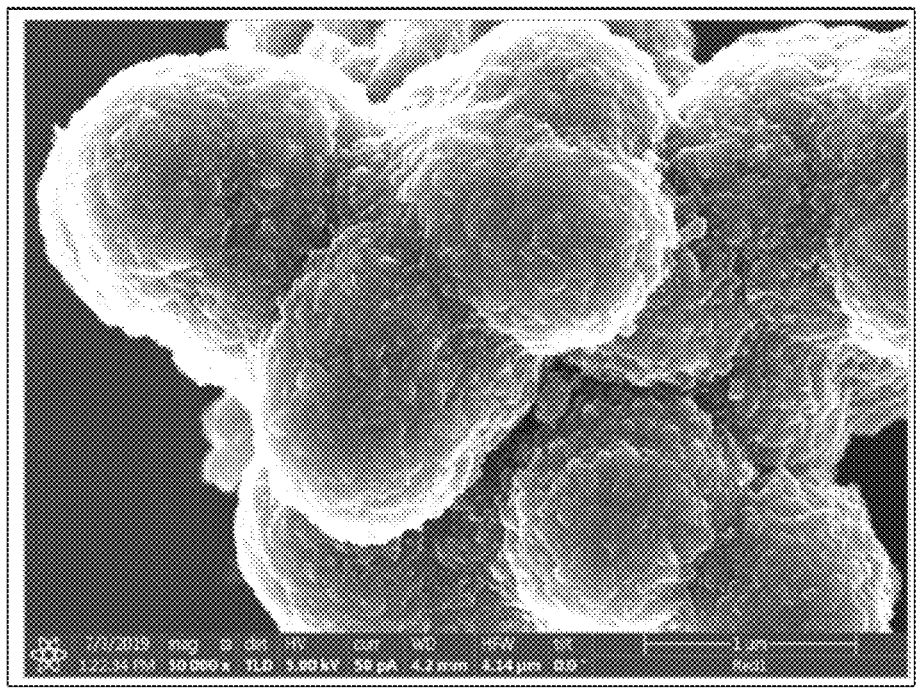
FIG. 10A shows a micrograph of an example carbon material that can be used in the sensing devices of FIG. 1, according to some implementations.

FIG. 10A shows a micrograph of one example carbon material 1000A suitable for detecting analytes, according to some other implementations. In some implementations, the undecorated carbon material 1000A may be used as the sensing materials for the sensing devices disclosed herein. In some other implementations, the carbon material 1000A may be decorated with metals, and the decorated carbon material 1000A may be used as the sensing materials for the sensing devices. As shown, the carbon material 1000A may have a shape of aggregate. In various implementations, the carbon material 1000A may contain a plurality of primary particles that are interconnected with one another via carbon-carbon (C—C) bonding. In some aspects, the each of the primary particles may include a plurality of graphene flakes joined together. As such, void spaces and pathways between individual aggregates and between individual primary particles provides the carbon material 1000A with a high surface area and an open pore structure for interacting with the analytes. In some implementations, the carbon material 1000A may also have void spaces and pathways within each of the primary particles.

Figure 10B:
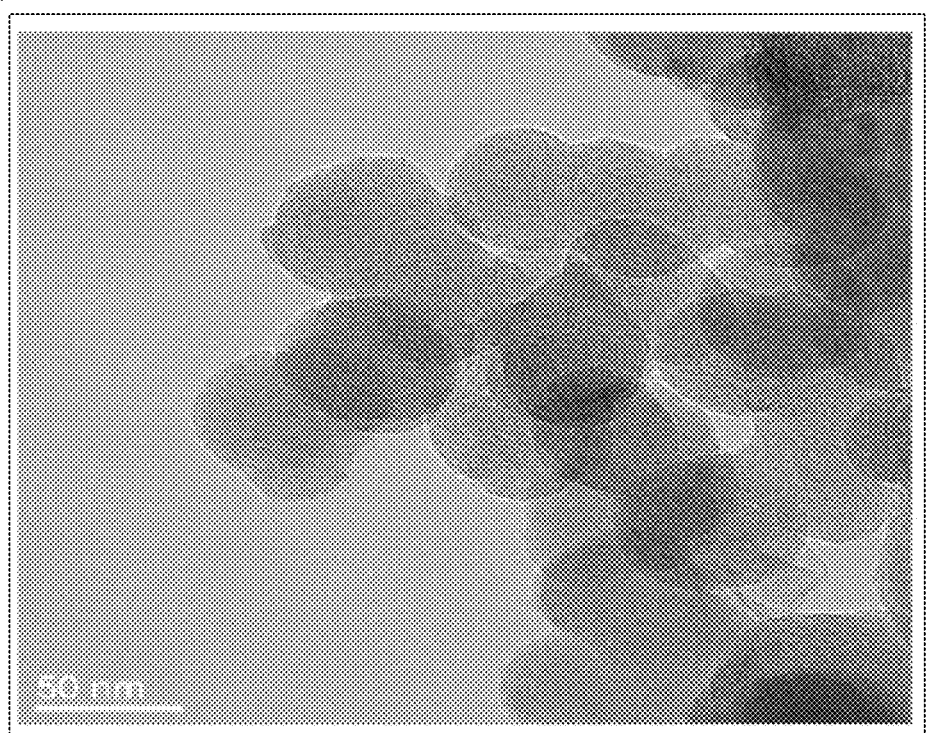
FIG. 10B shows a micrograph of another example carbon material that can be used in the sensing devices of FIG. 1, according to some other implementations.

FIG. 10B shows a micrograph of another example carbon material 1000B suitable for detecting analytes, according to some other implementations. As shown, the carbon material 1000B may be carbon nano onions (CNOs). In some implementations, the undecorated CNOs can be used as the sensing materials for the sensing devices disclosed herein. In some other implementations, the CNOs may be decorated with metals, and the decorated CNOs may be used as the sensing materials for the sensing devices. In various implementations, the CNOs are interconnected with one another via C—C bonding. As such, void spaces and pathways between individual CNO provides the carbon material 1000B with a high surface area and an open pore structure for interacting with the analytes.

Figure 10C:
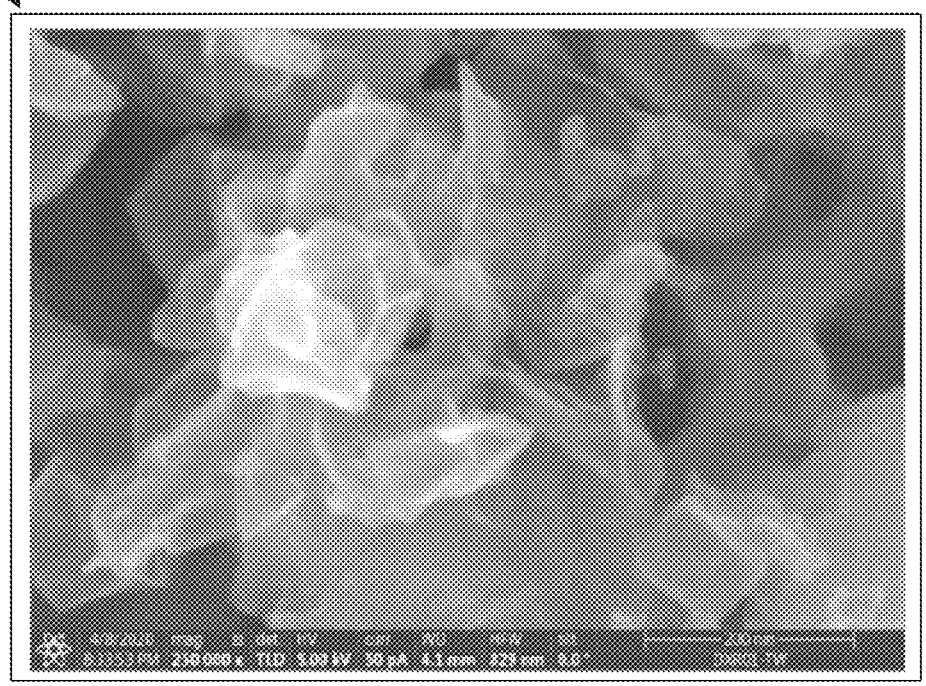
FIG. 10C shows a micrograph of another example carbon material that can be used in the sensing devices of FIG. 1, according to some other implementations.

FIG. 10C shows a micrograph of another example carbon material 1000C suitable for detecting analytes, according to some other implementations. In some implementations, the undecorated carbon material 1000C may be used as the sensing materials for the sensing devices disclosed herein. In some other implementations, the carbon material 1000C may be decorated with metals, such as platinum or palladium, and the decorated carbon material may be used as the sensing materials for the sensing devices. In various implementations, the carbon material 1000C may contain a plurality of graphene flakes that are interconnected with one another via C—C bonding. As such, void spaces and pathways between the graphene flakes provide the carbon material 1000C with a high surface area and an open pore structure for interacting with the analytes.

Figure 10D:
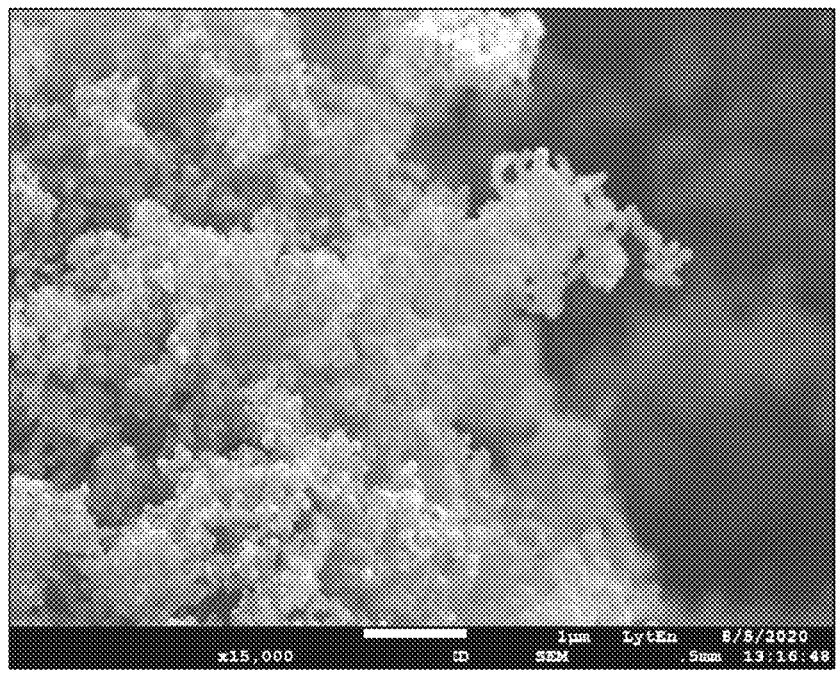
FIG. 10D shows a micrograph of another example carbon material that can be used in the sensing devices of FIG. 1, according to some other implementations.

FIG. 10D shows a micrograph of decorated CNOs 1000D that can be used as sensing materials, according to some other implementations. The process of making the decorated CNOs as shown in FIG. 10D may be performed by a thermal reactor or any suitable chemical reactors and processes. As an example, carbon nano onions (CNOs) may react with cobalt (II) acetate ($C_4H_6CoO_4$) to result in decoration of cobalt on active sites of the CNOs. In some other implementations, the CNOs may be decorated with other metals.

Figure 10E:
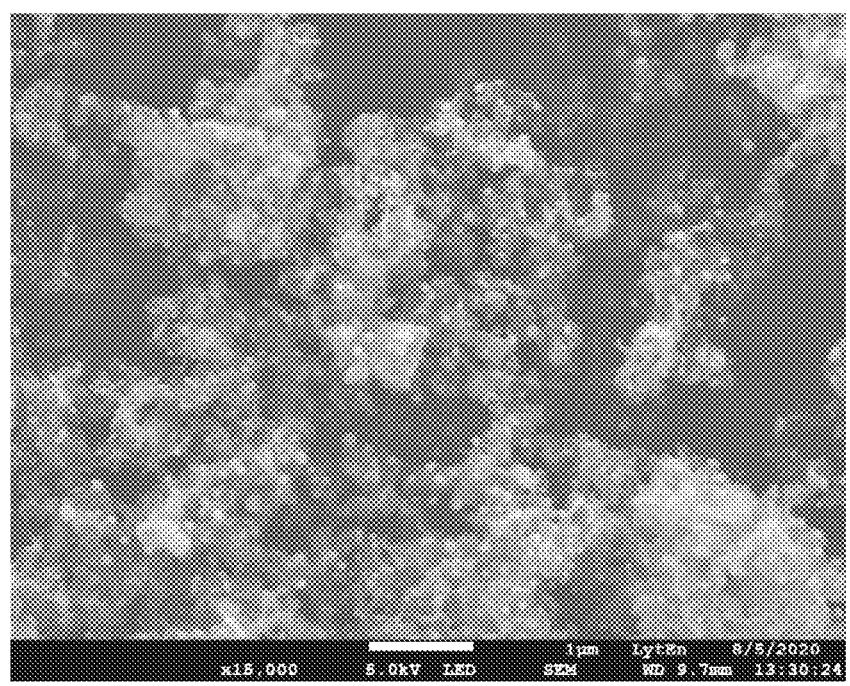
FIG. 10E shows a micrograph of another example carbon material that can be used in the sensing devices of FIG. 1, according to some other implementations.

FIG. 10E shows a micrograph of a decorated carbon material 1000E including the carbon material 1000C of FIG. 10C, according to some other implementations. The process of decorating the carbon material 1000C and making the decorated carbon material 1000E may be performed by a microwave reactor or any suitable chemical reactors and processes. As an example, the carbon material 1000C of FIG. 10C may react with silver acetate ($CH_3CO_2Ag$) to result in decoration of silver on active sites of the carbon material 1000C. In some other implementations, the carbon material 1000C may be decorated with other metals, such as cobalt or iron.

In various implementations, the decoration of the carbon materials with various reactive materials may be critical for efficient and selective detection of analytes. The graphene flakes disclosed by the present implementations may collectively form a convoluted 3D structure to prevent graphene restacking in the sensing materials. This convoluted 3D structure also increases the areal density of the materials, yielding higher analyte adsorption sites per unit area, and thereby improving chemical sensitivity of the sensing devices disclosed herein.

Figure 11:
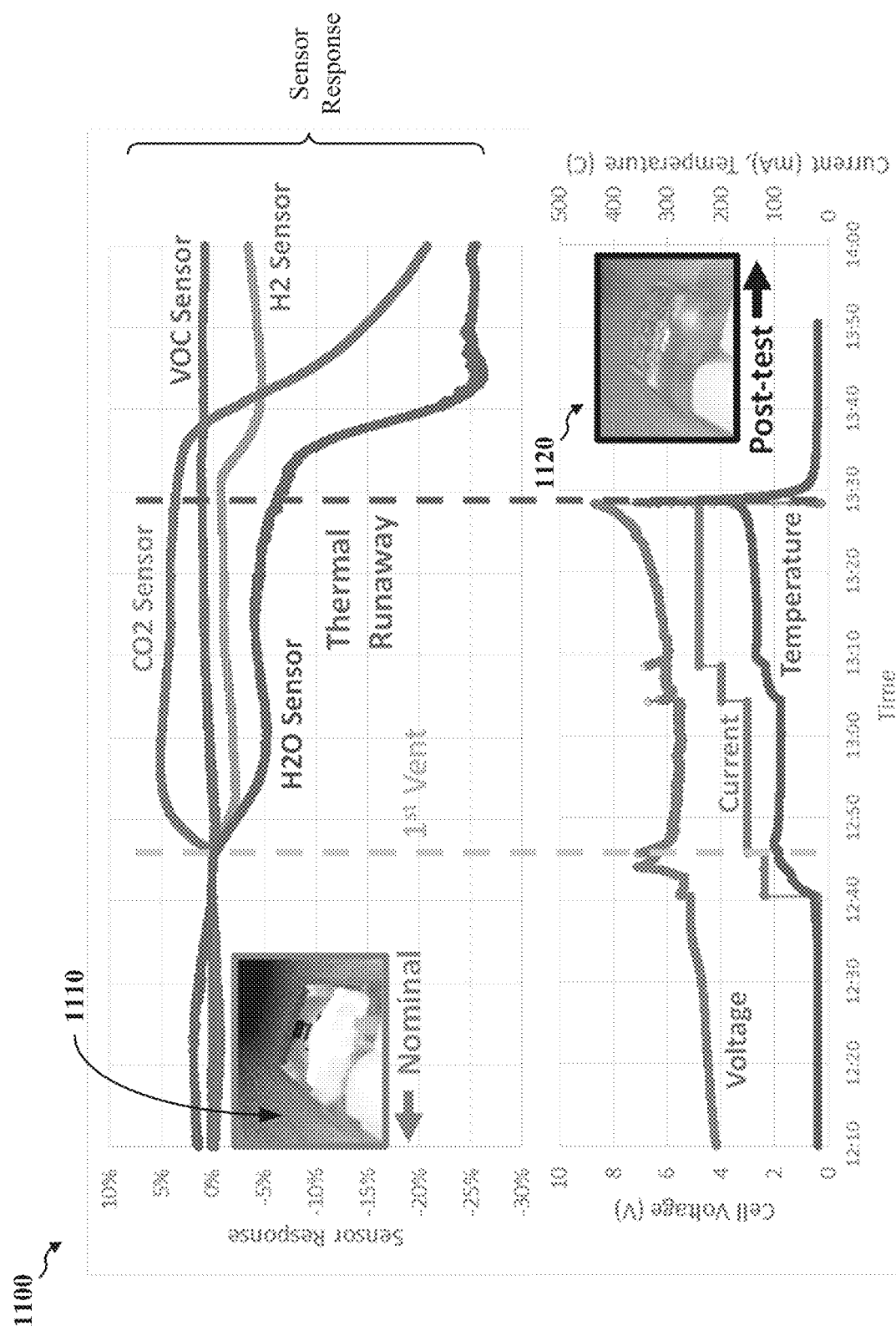
FIG. 11 shows a graph depicting an example sensor response when detecting presence of one or more analytes, according to some implementations.

FIG. 11 shows a graph depicting an example sensor response of the sensing service 120 of FIG. 1 when the sensing device 120 detects a presence of one or more analytes, according to some implementations. In some implementations, insert 1110 shows a battery enclosure that is operating in a normal condition. Another insert 1120 shows condition of the same battery enclosure shown in insert 1110 after the battery enclosure undergoes a thermal runaway. In some implementations, the battery enclosure shown in inserts 1110 and 1120 may be an example of the battery 210 of FIG. 2. In some other implementations, the battery enclosure shown in inserts 1110 and 1120 may be an example of any other battery enclosures that are suitable to enclose a plurality of battery cells.

As shown in FIG. 11, the battery enclosure shown in the inserts 1110 and 1120 may operate in a normal condition from time 12:10 to approximately 12:45. Because batteries do not release gases of any kinds if they are in normal condition, the sensor response is shown to be at 0%. When the battery enclosure undergoes a $1^{st}$ venting at approximately 12:45, the battery enclosure starts to release one or more analytes in relatively low concentrations and the sensing device described herein may pick up these small amounts of the analytes and generate a non-zero sensor response for each of the analytes. Based on the non-zero sensor response for each of the analytes, the sensing device 120 may detect that the battery enclosure is not operating in a normal condition approximately 40 minutes prior to the thermal runaway that happens at approximately 13:30, thereby elongating the time available for a user or system that uses the battery enclosure to take necessary remediations. In some instances, the remediations may include stopping operation of the battery enclosure, stopping charging of the battery enclosure, moving away from the battery enclosure, applying fire mitigation steps, or any combination thereof.

As used herein, a phrase referring to "at least one of" or "one or more of" a list of items refers to any combination of those items, including single members. For example, "at least one of: a, b, or c" is intended to cover the possibilities of: a only, b only, c only, a combination of a and b, a combination of a and c, a combination of b and c, and a combination of a, b, and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the application and design constraints imposed on the overall system.

Various modifications to the implementations described in this disclosure may be readily apparent to persons having ordinary skill in the art, and the generic principles defined herein may be applied to other implementations without departing from the spirit or scope of this disclosure. Thus, the claims are not limited to the implementations shown herein but are to be accorded the widest scope consistent with this disclosure, the principles and the novel features disclosed herein. Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be sometimes described herein in combination with one another, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations.

What is claimed is:

1. A battery safety system for detecting analytes in off-gases, the battery safety system comprising:
   a flow valve associated with a housing of a battery, the flow valve including a first valve coupled to a second valve, wherein:
      the first valve is embedded inside the housing and defines a cavity through which off-gases including analytes released from the battery flow towards the second valve; and
      the second valve extends through the housing to a surrounding environment and defines one or more openings through which the off-gases including the analytes exit the housing and dissipate into the surrounding environment; and
   a sensing device disposed within the cavity and in fluidic contact with the off-gases including the analytes flowing from the first valve to the second valve, the sensing device including at least one sensor configured to detect a presence of one or more of the analytes.

2. The battery safety system of claim 1, wherein the at least one sensor includes a sensing material configured to resonate at a frequency in response to an electromagnetic signal received from an external device.

3. The battery safety system of claim 2, wherein detection of the presence of the one or more analytes is based at least in part on a comparison between the resonant frequency and a calibration curve.

4. The battery safety system of claim 2, wherein the sensing material is carbon-based.

5. The battery safety system of claim 2, wherein detection of the presence of the one or more analytes is based at least in part on a change in one or more properties of the sensing material responsive to the electromagnetic signal.

6. The battery safety system of claim 5, wherein the one or more properties includes at least an impedance of the sensing material.

7. The battery safety system of claim 5, further including an antenna to receive the electromagnetic signal.

8. The battery safety system of claim 2, wherein detection of the presence of the one or more analytes is based at least in part on a frequency response of the sensing material to the electromagnetic signal.

9. The battery safety system of claim 8, wherein the sensing device is further configured to:
  identify the one or more analytes based at least in part on a comparison between the frequency response of the sensing material and one or more reference frequency responses.

10. The battery safety system of claim 8, wherein the frequency response of the sensing material is based on resonant impedance spectroscopy (RIS) sensing.

11. The battery safety system of claim 1, wherein the at least one sensor is coupled between a pair of electrodes disposed on a substrate of the sensing device.

12. The battery safety system of claim 1, wherein the at least one sensor comprises a carbon-based sensor.

13. The battery safety system of claim 1, wherein the at least one sensor comprises a metal oxide gas sensor.

14. The battery safety system of claim 1, wherein the sensing device is configured to generate a signal in response to the detected presence of the one or more analytes.

15. The battery safety system of claim 14, wherein the sensing device is further configured to output the signal to a user.

16. The battery safety system of claim 14, wherein the signal indicates a dangerous operating mode of the battery system.

17. The battery safety system of claim 14, wherein the signal indicates a potential onset of battery thermal runaway.

18. The battery safety system of claim 14, further comprising a battery management system (BMS) coupled to the sensing device, the BMS configured to initiate one or more remediation actions responsive to the signal.

19. The battery safety system of claim 18, wherein the one or more remediation actions includes terminating operation of the battery.

20. The battery safety system of claim 1, wherein the flow valve further includes a porous membrane configured to prevent moisture and contaminants from entering the battery.

21. The battery safety system of claim 20, wherein the flow valve further includes a cap positioned above the porous membrane, the cap configured to protect the porous membrane from external or environmental elements.

22. The battery safety system of claim 1, wherein the one or more analytes include water vapor ($H_2O$), carbon dioxide ($CO_2$), carbon monoxide (CO), ethylene ($C_2H_4$), ethane ($C_2H_6$), ethyl acetate ($C_4H_8O_2$), hydrogen fluoride (HF), hydrogen ($H_2$), ethylene carbonate ($C_3H_4O_3$), dimethyl carbonate ($C_3H_6O_3$), sulfur dioxide ($SO_2$), hydrogen sulfide ($H_2S$), or any combination thereof.

23. The battery safety system of claim 1, wherein the battery is disposed within or associated with a consumer electronic device, an Electric Vehicle (EV), Unmanned Aerial Vehicles (UAVs), or a Stationary Energy Storage System (SESS).

24. The battery safety system of claim 1, wherein the one or more openings define a cross-sectional area, and wherein a flow rate of the off-gases including analytes through the cavity is tuned by changing the cross-sectional area.

* * * * *